United States Patent
LaChartre

(10) Patent No.: US 8,077,068 B2
(45) Date of Patent: Dec. 13, 2011

(54) QUANTIZER, ANALOGUE-TO-DIGITAL CONVERTER COMPRISING SUCH A QUANTIZER, AND ULTRA-WIDE BAND RECEIVER INTEGRATING SUCH A CONVERTER

(75) Inventor: David LaChartre, Montbonnot (FR)

(73) Assignee: Commissariat A l'Energie Atomique et Aux Energies Alternatives, Paris (FR)

(\*) Notice: Subject to any disclaimer, the term of this patent is extended or adjusted under 35 U.S.C. 154(b) by 0 days.

(21) Appl. No.: 12/730,435

(22) Filed: Mar. 24, 2010

(65) Prior Publication Data
US 2010/0176982 A1    Jul. 15, 2010

Related U.S. Application Data

(63) Continuation of application No. PCT/FR2008/051813, filed on Oct. 7, 2008.

(30) Foreign Application Priority Data

Oct. 12, 2007  (FR) .................................... 07 58284

(51) Int. Cl.
*H03M 1/12* (2006.01)
(52) U.S. Cl. ........ 341/155; 341/118; 341/120; 341/158; 341/159; 341/161
(58) Field of Classification Search .......... 341/118–120, 341/143, 155, 161
See application file for complete search history.

(56) References Cited

U.S. PATENT DOCUMENTS

| | | | | |
|---|---|---|---|---|
| 4,954,831 A | * | 9/1990 | Ekins | 341/159 |
| 5,760,730 A | | 6/1998 | Fischer et al. | |
| 5,892,474 A | * | 4/1999 | Sugawara | 341/200 |
| 5,894,283 A | * | 4/1999 | Fischer et al. | 341/161 |
| 6,037,891 A | * | 3/2000 | Griph | 341/161 |
| 6,101,376 A | * | 8/2000 | Bell | 455/218 |
| 6,480,132 B1 | * | 11/2002 | Yoshioka et al. | 341/155 |
| 6,621,433 B1 | * | 9/2003 | Hertz | 341/139 |
| 6,867,723 B1 | * | 3/2005 | Tachibana et al. | 341/155 |
| 7,170,930 B2 | * | 1/2007 | Denny et al. | 375/229 |
| 7,386,074 B1 | * | 6/2008 | Venkatesh et al. | 375/345 |
| 7,733,260 B2 | * | 6/2010 | Lee et al. | 341/155 |
| 7,786,918 B2 | * | 8/2010 | Fukuzawa et al. | 341/155 |
| 7,868,665 B2 | * | 1/2011 | Tumer et al. | 327/70 |

\* cited by examiner

*Primary Examiner* — Linh Nguyen
(74) *Attorney, Agent, or Firm* — Burr & Brown

(57) ABSTRACT

The invention relates to an N-bit asynchronous Quantizer including a $2^N-1$ signal amplifier stages $(G_1^2-G_{2^N-1}^2)$ arranged in series, the input of the first stage being capable of receiving a signal to be quantized; $2^N-1$ comparators $(C_1^2-C_{2^N-1}^2)$, one comparator being connected to the output of each amplifier stage $(G_1^2-G_{2^N-1}^2)$, and capable of comparing the value of this output with a predetermined threshold value; and at least $2^N-2$ delay lines $(D_1^2-D_{2^N-1}^2)$ placed at the output of the $2^N-2$ first comparators, the signals supplied at the output of the delay lines $(D_1^2-D_{2^N-1}^2)$ and of the last comparator constituting at any instant the quantized binary values of the input signal with a time shift.

25 Claims, 6 Drawing Sheets

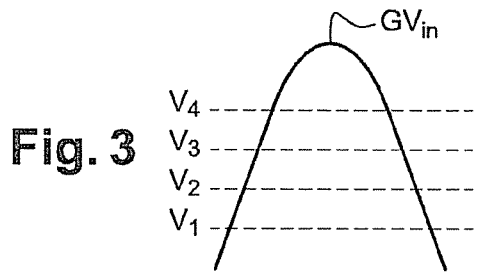
Fig. 3
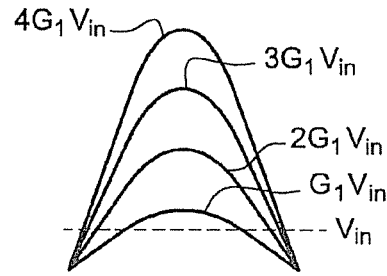
Fig. 5
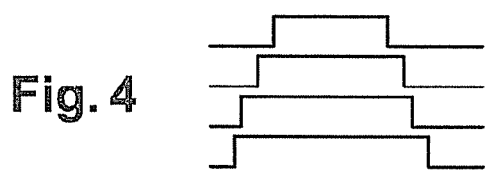
Fig. 4
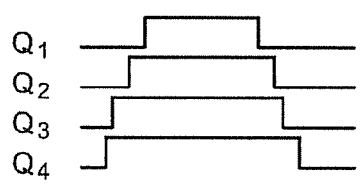
Fig. 6
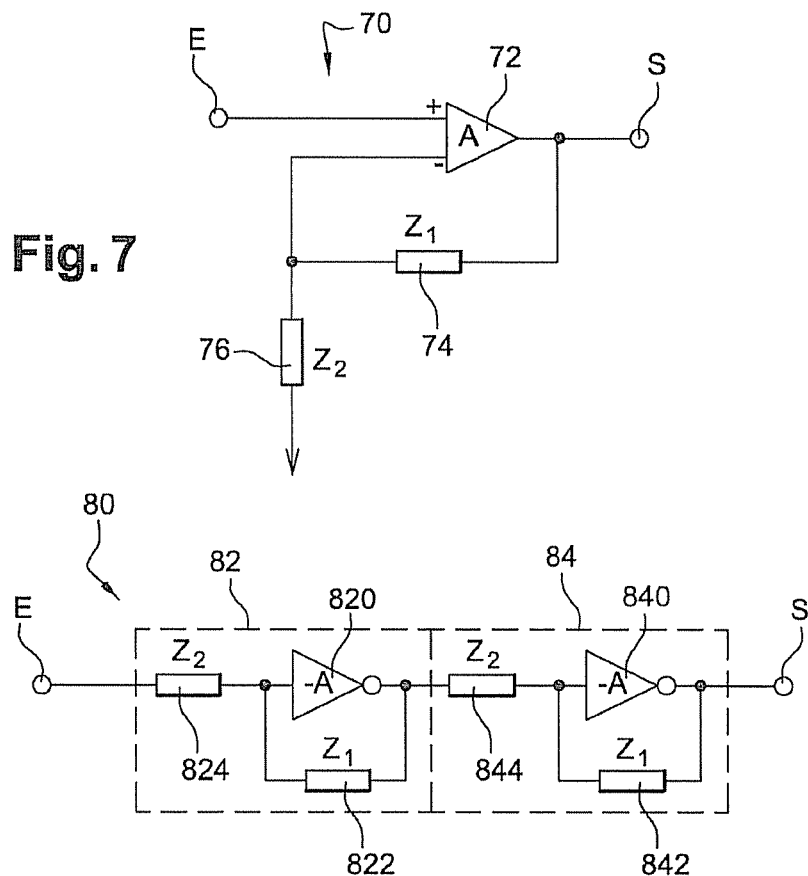
Fig. 7
Fig. 8

QUANTIZER, ANALOGUE-TO-DIGITAL CONVERTER COMPRISING SUCH A QUANTIZER, AND ULTRA-WIDE BAND RECEIVER INTEGRATING SUCH A CONVERTER

BACKGROUND OF THE INVENTION

The present invention relates to the field of analogue signal quantization, and to be more specific high-speed analogue signal quantization.

The present application can be used particularly in the reception of data transmitted in the form of a radio wave, and to be more specific in a reception of the ultra-wide band type.

PRIOR ART

Some applications, such as data transmission using radio waves for example, require analogue-to-digital conversion at very high speed, possibly reaching several gigasamples per second.

To this end, analogue-to-digital converters, or ADCs, of the flash type are commonly used on account of their conversion speed. The principle of an ADC of this type comprises comparing the signal for conversion with as many different voltages as there are conversion steps required.

An example of an N-bit flash ADC is given in diagram form in FIG. 1 under the general reference number 10. This ADC includes $2^N-1$ voltage comparators $C_1^1, C_2^1, C_3^1, \ldots, C_{2^N-1}^1$, an amplifier $G^1$, and $2^N-2$ resistances $R_1^1, R_2^1, R_3^1, \ldots, R_{2^N-1}^1$ connected in series between a reference voltage $V_{ref}$ and the earth.

The voltage amplifier $G^1$ receives at input and amplifies a voltage $V_{in}$ to be quantized and sampled, and is connected at output to each of the positive inputs (+) of the comparators $C_1^1, C_2^1, C_3^1, \ldots, C_{2^N-1}^1$ to which it delivers an amplified voltage $V_{amp}$.

The $2^N-2$ resistances $R_1^1, R_2^1, R_3^1, \ldots, R_{2^N-1}^1$ are of identical value R and constitute a voltage divider bridge defining $2^N-2$ voltages $V_2, V_3, \ldots, V_{2^N-1}$. The first comparator $C_1^1$ has its negative terminal (−) connected to the voltage Vref and the other comparators $C_2^1, C_3^1, \ldots, C_{2^N-1}^1$ have their negative terminal (−) connected to the voltages $V_2, V_3, \ldots, V_{2^N-1}$ respectively.

The amplified voltage $V_{amp}$ therefore attacks the comparators $C_1^1, C_2^1, C_3^1, \ldots, C_{2^N-1}^1$ in parallel and simultaneously, and is thus compared with $2^N-1$ threshold voltages $V_1=V_{ref}, V_2, V_3, \ldots, V_{2^N-1}$. The outputs of the comparators $C_1^1, C_2^1, C_3^1, \ldots, C_{2^N-1}^1$ thereby define the quantized binary values $Q_1, Q_2, Q_3,$ to $Q_{2^N-1}$ of the flash ADC.

Furthermore, the comparators $C_1^1, C_2^1, C_3^1, \ldots, C_{2^N-1}^1$ are synchronous, in other words they deliver the result of their comparison on the rising or falling edges of a sampling clock H.

The flash ADC thus quantizes the signal $V_{in}$ with a constant quantization step while simultaneously sampling it at the frequency of the clock H signal.

Given the parallel arrangement of the comparators $C_1^1, C_2^1, C_3^1, \ldots, C_{2^N-1}^1$, very high speeds can be attained. Commonly the conversion speed of this type of converter is restricted solely by the operating speed of the comparators.

But a flash ADC poses the following problems.

Firstly, the signal $V_{in}$ needs to be amplified in terms of amplitude in order to make best use of the dynamic range of the ADC. There is thus a biased amplification at the level of each comparator. Indeed, considering this linear ADC, it may be considered that the amplification by the amplifier $G^1$ is equivalent to a reduction, by the gain of the amplifier $G^1$, of all the threshold voltages $V_1, V_2, V_3, \ldots, V_{2^N-1}$. The amplification of the signal $V_{in}$ may thus be seen as included in the comparison function itself, in other words a comparison that includes an amplification biased by the presence of the threshold voltages.

Then, the signal to be quantized $V_{in}$ also needs to be amplified in terms of power, in order to charge the $2^N-1$ comparators $C_1^1, C_2^1, C_3^1, \ldots, C_{2^N-1}^1$ in parallel. Thus for the flash ADC to operate satisfactorily, the amplifier $G^1$ must therefore be powerful, linear, and low-noise. Moreover, in the case of weak signals for $V_{in}$, a significant amplification must be produced in a single stage. All these constraints make the amplifier $G^1$ difficult to design and in the best case scenario result in a high energy-consuming amplifier.

Additionally, to hold the charge in the comparators, it is often necessary, if not essential, to build in powerful buffers, which then increases consumption still further.

The purpose of the present invention is to resolve the aforementioned problems by proposing an energy-saving quantizer, which allows quantization comparable to that of flash ADCs, and in particular as regards the speed of quantization.

SUMMARY OF THE INVENTION

To this end the first object of the invention is an N-bit asynchronous quantizer comprising:
- $2^N-1$ signal amplifier stages arranged in series, the first stage input being capable of receiving a signal to be quantized; and
- $2^N-1$ comparators, one comparator being connected to the output of each amplifier stage, and capable of comparing the value of this output with a predetermined threshold voltage; and
- at least $2^N-2$ delay lines placed at the output of the $2^N-2$ first comparators, the outputs of the delay lines and of the last comparator defining the quantized binary values of the quantizer.

Put another way, with an architecture of this kind, amplification is implemented simultaneously with quantization, and gradually.

Thus, to obtain the amplification required for optimum use of the dynamic range of the quantizer, amplifiers may be used which have gains of the order of the gain of the flash ADC amplifier divided by $2^N$. In fact, these amplifiers are low-power, together consume less than the amplifier used in the flash ADC, and display a more linear behaviour.

Furthermore, since amplification is simultaneous with quantization, it is not necessary to provide amplification upstream of the quantizer to ensure that the dynamic range of the quantizer is effectively exploited in full.

Additionally, its gain may to advantage be selected between 1 and 2, in the knowledge that amplifiers offering such a gain are of straightforward design and reduced consumption.

Moreover, the architecture is relatively insensitive to the nonlinearities of its electronic components. Indeed, the nonlinearities appear when the signals to which they are subjected assume high values. This is for example the case with saturation phenomena.

But, where a stage output exceeds the threshold associated therewith, it is known that the thresholds of the following comparators will also be exceeded on account of the amplification applied by the consecutive stages. The nonlinearities of the following amplifiers has thus no effect on quantization since the quantization implemented by an architecture of this kind starts with the most significant bit, associated with the first amplifier stage, and finishes with the least significant bit, associated with the last amplifier stage. This is especially advantageous when the signal to be quantized assumes a value greater than the first threshold, since all the nonlinearities of the following components in the chain have no effect on quantization. In fact, an amplifier only needs to be linear up to the threshold value associated therewith.

According to particular inventive embodiments, the quantizer includes one or more of the following features.

The absolute value of an amplifier stage gain is between about 1 and about 2. Low energy consuming low-gain amplifiers of straightforward design are thus used.

The amplifier stage gains are substantially identical. In such a case, a quantization with logarithmic compression is obtained, which is advantageous where the signals display a large dynamic range.

The absolute value of an amplifier stage gain, apart from the first one, is substantially equal to $i/(i-1)*G1$, where G1 is the first amplifier stage gain and i the position of the amplifier stage in the amplifier stage sequence. A quantization is thus obtained with constant step amplitudes between two consecutive amplifier stages. We are thus back to the quantization commonly implemented in flash ADCs.

The amplifier stage gain is negative. In this way, it is possible, simultaneously with the quantization, to rectify the signal to be quantized. Additionally, use may be made of inverters, which are low-energy consuming components of straightforward design.

An amplifier stage is also provided in order to filter the DC component of the signal to be quantized. This is particularly useful where the signal to be quantized theoretically displays a zero DC component. A parasitic DC offset is thus filtered. This is for example implemented using the amplifier stage gain which is chosen so as to be substantially zero at low frequencies.

Each amplifier stage is of the automatic gain control type. In this way, it is ensured that quantization occurs over the whole dynamic range of the signal $V_{in}$. This is particularly advantageous where RF reception is involved in order to match the strength of the signal received.

Each amplifier stage comprises:
a differential amplifier, whereof a positive input constitutes the amplifier stage input;
a first impedance, connected between a negative input and an output of the differential amplifier; and
a second impedance, connected between the negative input of the differential amplifier and an earth.

Each amplifier stage comprises a series arrangement of two amplifier cells, each of these cells consisting of:
an inverter, whereof the output constitutes the cell output,
a first impedance connected between the input and the output of the inverter, and
a second impedance connected at one of its terminals to the inverter input, and whereof the other terminal constitutes the cell input.

It is thus possible to shape the gain frequency response via an appropriate choice of the value of the impedances. For example, narrow band gains are conceivable of the band-pass type tuned to the signal to be quantized.

The amplifier stage may comprise:
an inverter, whereof the output constitutes the amplifier stage output,
a first impedance connected between the input and the output of the inverter, and
a second impedance connected at one of its terminals to the inverter input, and whereof the other terminal constitutes the stage input.

In this way, an interlaced quantization of the positive and negative half-waves of the signal to be quantized is obtained. The number of stages is thus divided by two on the assumption that the signal received varies little between the positive and negative half-waves.

Preferably, where an amplifier stage gain is negative, the quantizer further comprises a digital processing module capable of applying an "OR" function to each pair of consecutive outputs of the delay lines, the result of the "OR" function constituting a quantized binary value. The quantizer thus implements simultaneously a quantization and a rectification. Additionally, the last stage supplies the sign of the signal to be quantized.

Preferably, the DC value of the second impedance is substantially higher than the DC value of the first impedance, in order to filter the DC component and ensure that a DC offset, introduced for example by the quantizer components, does not propagate along the amplifier chain.

Preferably, the first impedance is the one defined between the drain and the source of an MOS transistor. It is thus possible to control the amplifier stage gain in a straightforward way by controlling the voltage applied to the gate of the MOS transistor. It is then possible to provide means for the automatic control of the amplifier stage gain via an appropriate control of this gate voltage.

The threshold value may be unique for all the comparators. Identical comparators may thus be selected for the quantizer thereby reducing the risks of the quantizer component characteristics being dispersed. Additionally, by using a single low value threshold voltage, the quantization properties (dynamic range of the quantization, logarithmic compression, constant step, etc.) are mainly fixed through the choice of amplifier stage gains.

Each comparator may comprise:
a high-gain differential amplifier, receiving on one positive input the corresponding amplifier stage output, and on a negative input the corresponding threshold value,
and a binary decision-making module, connected to the high-gain differential amplifier output.

Preferably, the binary decision-making module includes a discriminator with hysteresis. In this way, the quantized values are correctly saturated.

The quantizer may comprise a filtering module connected to the binary decision-making module output in order to eliminate pulses of duration below a predetermined duration. This translates into a noise reduction and better quantization behaviour at high frequencies.

The quantizer may further comprise a delay line connected to the output of each comparator, the delay lines being arranged in order to deliver the output of the comparators substantially at the same instant. Preferably, each delay line comprises $2^N-1-i$ substantially identical delay cells, where i is the position of the amplifier stage associated with the line in the amplifier stage sequence.

In this way, the delays induced by the propagation of the signal along the amplifier chain are compensated.

The quantizer may also comprise, at the start or at the end of the amplifier stage sequence, an additional amplifier stage, and an additional comparator connected to the additional amplifier stage output, and capable of comparing the output thereof with the zero value in order to determine the sign of the signal to be quantized.

Another object of the present invention is an N-bit analogue-to-digital converter comprising a quantizer of the aforementioned type and a sampler connected to the quantizer, and capable of sampling the signals it receives at input.

Put another way, in a converter of this kind, the quantization function is dissociated from the sampling function, which results from the quantizer architecture which is by nature asynchronous. It is thus possible to apply any asynchronous digital processing operation that may be deemed useful to the quantized signal before it is sampled.

This is particularly advantageous when the relevant information contained in the quantized signal is contained in a range of low frequencies, as is generally the case with the reception of modulated radiofrequency data, for which only the signal envelope is useful. Before sampling, it is therefore possible to apply an envelope extraction, by using a low-pass filter for example, and then to sample at low frequency. An energy saving is then obtained since it is unnecessary to provide a high energy consuming high-speed sampler.

According to particular inventive embodiments, the converter comprises one or more of the following features.

The converter may comprise a digital processing module connected between the quantizer and the sampler.

A further object of the invention is an ultra-wide band receiver comprising a converter of the aforementioned type.

BRIEF DESCRIPTION OF THE DRAWINGS

The invention will be better understood from reading the following description, given solely by way of example, and produced in relation to the appended drawings, wherein.

DETAILED DESCRIPTION OF THE INVENTION

Quantizer According to the Invention

Figure 2:
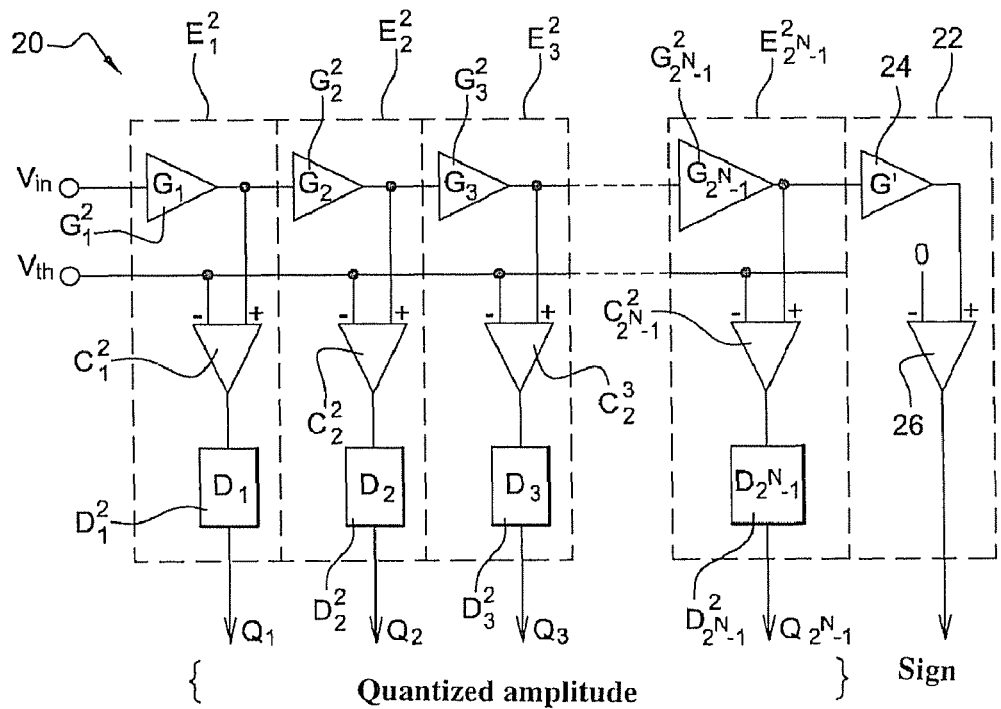
FIG. 2 is a diagrammatic view of a first embodiment of the inventive quantizer.

In FIG. 2, an N-bit voltage quantizer 20 includes $2^N-1$ quantization stages $E_1^2$-$E_{2^N-1}^2$ arranged in series.

Each quantization stage $E_1^2$-$E_{2^N-1}^2$ comprises:
a voltage amplifier $G_1^2$-$G_{2^N-1}^2$ of predetermined gain;
a voltage comparator $C_1^2$-$C_{2^N-1}^2$, whereof the positive input (+) is connected to the output of the voltage amplifier $G_1^2$-$G_{2^N-1}^2$, and whereof the negative input (−) receives a unique threshold voltage $V_{th}$; and
a delay cell $D_1^2$-$D_{2^N-1}^2$, whereof the input is connected to the output of the voltage comparator $C_1^2$-$C_{2^N-1}^2$, and which applies a predetermined delay to this output.

The voltage amplifiers $G_1^2$-$G_{2^N-1}^2$ are connected in series, the first $G_1^2$ of them receiving a voltage to be quantized $V_{in}$.

The outputs of the delay cells $D_1^2$-$D_{2^N-1}^2$ constitute for their part the quantized binary values $Q_1$-$Q_{2^N-1}$ of the N-bit quantizer 20. Their delay is selected to compensate the delay accumulating along the amplifier chain constituted by the amplifiers $G_1^2$-$G_{2^N-1}^2$, in such a way that the binary values $Q_1$-$Q_{2^N-1}$ are temporally adjusted to the same instant, thereby obtaining a temporal coherence for them.

It is thus possible to quantize an input signal asynchronously in continuous time, in other words a non-sampled signal, since the signals continuously supplied to the output of the delay cells $D_1^2$-$D_{2^N-1}^2$ constitute the quantized binary values corresponding to the input signal with a time shift corresponding to the propagation time through the quantizer.

It will be noted that the last delay cell $D_{2^N-1}^2$ is optional, as in the example relative to FIG. 23 described hereinafter.

Optionally, the quantizer 20 also comprises a stage 22 for the determination of the sign of the voltage $V_{in}$. The stage 22 comprises an amplifier 24, arranged in series with the amplifier $G_{2^N-1}^2$ of the last quantization stage $E_{2^N-1}^2$.

The stage 22 includes furthermore a comparator 26, connected by its positive input (+) to the output of the amplifier 24, and receiving at its negative input (−) a zero voltage, the output of the comparator 26 thereby giving the sign of the voltage $V_{in}$. In a first alternative embodiment of the quantizer in FIG. 2, a quantization with logarithmic compression is implemented by choosing for the gains of the amplifiers $G_1^2$-$G_{2^N-1}^2$ a unique predetermined value G.

Indeed, in a situation of this kind, the voltage $V_{in}$ is quantized in accordance with the scale of values $$\left\{ \frac{V_{th}}{G^{2^N-1}}, \cdots, \frac{V_{th}}{G^3}, \frac{V_{th}}{G^2}, \frac{V_{th}}{G} \right\}.$$

This alternative is for example useful in an application to the quantization of a signal displaying a wide dynamic range.

In a second alternative embodiment of the quantizer in FIG. 2, a quantization with a constant step amplitude, in other words a quantization similar to that implemented in a conventional flash ADC, is implemented by choosing for each amplifier $G_2^2$-

$$\frac{G_{i \cdot 2^N-1}^2}{i-1},$$

from the second position in the amplifier chain a gain substantially equal to where i is the position of the amplifier in the chain.

Indeed, in a situation of this kind, the voltage $V_{in}$ is quantized in accordance with the scale of values $$\left\{ \frac{V_{th}}{(2^N-1) \times G_1}, \cdots, \frac{V_{th}}{3 \times G_1}, \frac{V_{th}}{2 \times G_1}, \frac{V_{th}}{G_1} \right\},$$

where $G_1$ is the gain of the first amplifier $G_1^2$ in amplifier chain.

FIGS. 3 to 6 show a quantization of this kind with constant step amplitude.

Figure 1:
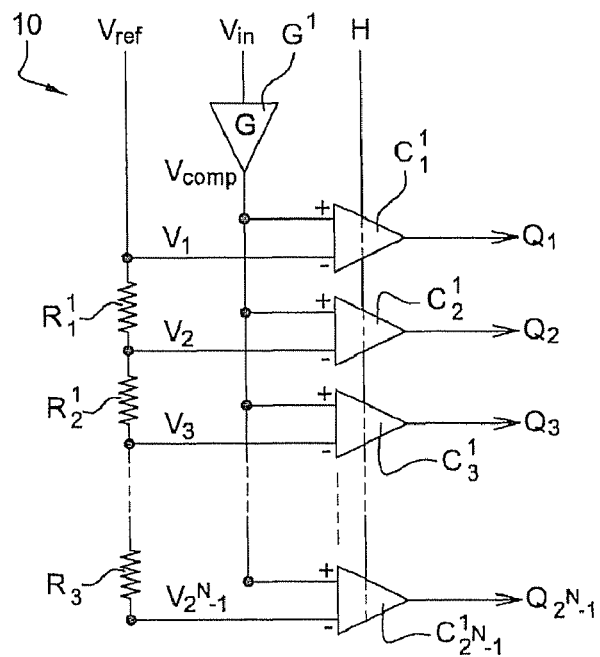
FIG. 1 is a diagrammatic view of a conventional flash ADC, which has already been discussed in the pre-characterizing portion.
Figure 3:
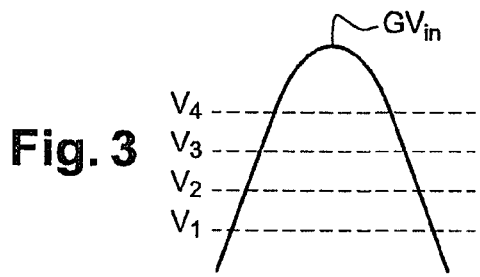
FIGS. 3 to 6 are graphs showing the quantization implemented by the invention compared with the quantization implemented by a conventional flash ADC.
Figure 4:
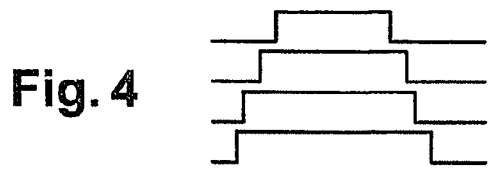

FIGS. 3 and 4 show the quantization implemented by the conventional flash ADC in FIG. 1. In FIG. 3, the temporal evolution of the amplified voltage $G \times V_{in}$ at the output of the amplifier $G^1$ is shown, as are the first four threshold voltages $V_1, V_2, V_3$ and $V_4$. FIG. 4 shows the corresponding temporal evolution of the first four quantized values $Q_1, Q_2, Q_3$ and $Q_4$ at the output of the first four comparators $C_1^1, C_2^1, C_3^1, C_4^1$.

Figure 5:
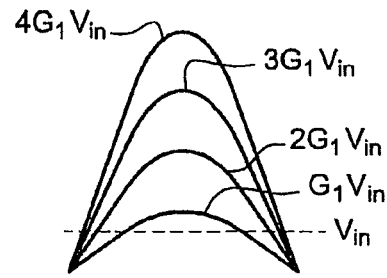
Figure 6:
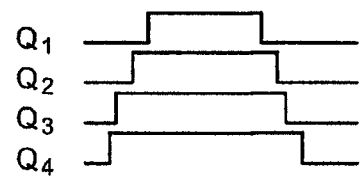

FIGS. 5 and 6 for their part show the quantization with constant step amplitude implemented by the quantizer in FIG. 2, also for the first four quantized values $Q_1, Q_2, Q_3$ and $Q_4$.

As may be noted, the quantization obtained by quantizing these two devices is identical.

However, in the conventional flash ADC, it is necessary to amplify the voltage $V_{in}$ with a very significant gain in order to obtain a comparison with all the reference voltages $V_1, V_2, V_3, \ldots V_{2^N-1}$.

In the inventive quantizer, when a unique threshold voltage $V_{th}$ is chosen for all quantization stages $E_1^2 \text{-} E_{2^N-1}^2$, it is unnecessary to amplify the voltage in order to be sure of using the whole dynamic range of the quantization if the amplifier gains are chosen as a consequence and/or are variable gains.

Preferably, the gains of the amplifiers $G_1^2 \text{-} G_{2^N-1}^2$ from the second amplifier $G_2^2$ are strictly between 1 and 2. The gain of the first amplifier $G_1^2$ may for its part be equal to 1.

It is in fact known that it is straightforward to produce amplifiers that have such gains. Additionally, such amplifiers consume little energy and display great linearity compared with high-gain amplifiers, such as the amplifier $G^1$ used in a conventional flash ADC in FIG. 1.

Also preferably, the gains of the amplifiers $G_1^2 \text{-} G_{2^N-1}^2$ are selected as a function of the particular use to which the quantizer is to be put.

To be more specific, amplifiers display a non-zero gain solely in the expected frequency band of the voltage $V_{in}$. For example, in the event of an expected voltage $V_{in}$ not comprising a DC component, the gains of the amplifiers $G_1^2 \text{-} G_{2^N-1}^2$ are of the high-pass or pass band type, so as to filter the low frequencies.

This is particularly advantageous since the amplifier frequency band selection effects accumulate along the amplifier chain. Thus, for the last quantization stages, a parasitic, for example DC, component received at input is substantially cancelled by successively filtering it through the amplifiers $G_1^2 \text{-} G_{2^N-1}^2$. Considering for example identical gains with a −20 dB attenuation of the DC, the filtering of the DC at the quantizer output is $-(2^N-1)*20$ dB, without however providing for complex filters.

This is particularly advantageous in so far as the last quantization stages, which correspond to the least significant bits of the quantization, are intended for the quantization of low value signals that are particularly sensitive to extraneous noise and nonlinearities.

Additionally, the fact of using limited frequency band amplifiers makes it possible also to use limited frequency band comparators $C_1^2 \text{-} C_{2^N-1}^2$ that consume less energy than wide band comparators, as is commonly the case with conventional flash ADCs.

Figure 7:
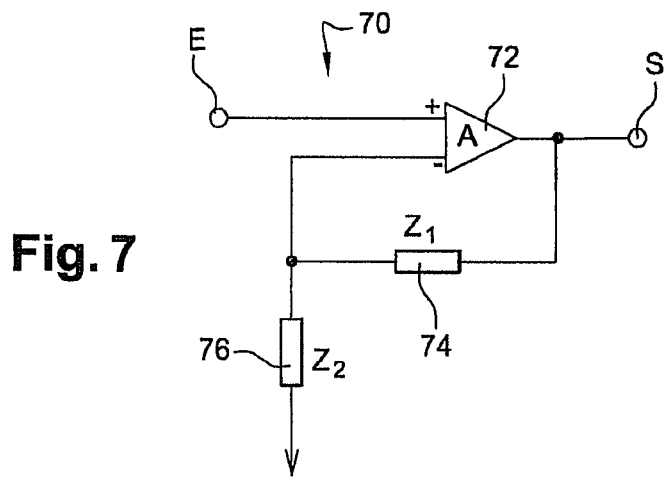
FIG. 7 is a diagrammatic view of a first embodiment of an amplifier stage forming a constituent part of the quantizer in FIG. 2.

A first embodiment 70 of an amplifier $G_1^2 \text{-} G_{2^N-1}^2$ is shown in FIG. 7.

The amplifier 70 comprises:
a differential amplifier 72 of gain A, receiving on its positive terminal (+) the voltage for amplification, and delivering at its output the amplified voltage,
a first impedance 74 of value $Z_1$, connected between the output of the differential amplifier 72 and the negative terminal (−) thereof,
and a second impedance 76 of value $Z_2$, connected between the negative terminal (−) of the differential amplifier 72 and the earth.

The transfer function between the output S and the input E of the amplifier 70 is thus given by the relation:

$$\frac{S}{E} = \frac{A \times (Z_1 + Z_2)}{Z_1 + (1+A) \times Z_2}.$$

The effect of the negative feedback by means of the impedance 74 is to adjust the gain of the amplifier 70 with precision. Indeed, gain adjustment is more accurate using the passive component constituted by the impedance 74 than by using an active component.

The values $Z_1$ and $Z_2$ of the impedances 72 and 74 are furthermore selected in order to shape the frequency response of the amplifier 70, for example as a function of the frequency band of the voltage to be quantized $V_{in}$, as has been mentioned above.

Preferably, the values $Z_1$ and $Z_2$ are also chosen so that the transfer function of the amplifier 70 is of the high-pass type, so as not to amplify a parasitic DC offset $V_{offset}$ that may appear between the positive (+) and negative (−) terminals of the differential amplifier 72. It is known in fact that it is a common occurrence for the response of the differential amplifier 72 to be of the type $S=A(V_+ - V_- + V_{offset})$, where $V_+$ and $V_-$ are the voltages at the positive (+) and negative (−) terminals of the differential amplifier 72 respectively and $V_{offset}$ a parasitic DC offset.

So, for DC, the value of $Z_2$ is substantially greater than the value of $Z_1$. For example, the impedance 76 is a resistance, and the impedance 74 is constituted by a resistance in parallel with an inductance, or the impedance 74 is a resistance and the impedance 76 is constituted by a resistance in series with a capacitor.

When a resistance is chosen for one and/or the other of the impedances 74 and 76, it is preferably implemented in the form of the resistance between the drain and the source of an MOS transistor. The value of this resistance, and therefore that of the gain of the amplifier 70, may thus be adjusted by the voltage applied to the gate of the MOS transistor.

A gain control is also implemented by steering this gate voltage.

Figure 8:
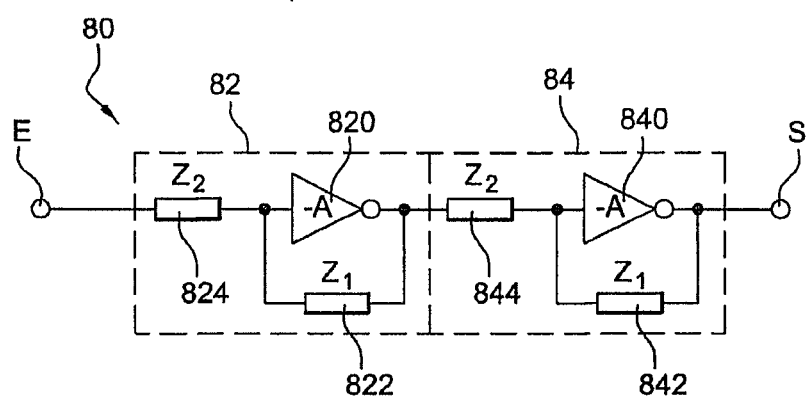
FIG. 8 is a diagrammatic view of a second embodiment of an amplifier stage forming a constituent part of the quantizer in FIG. 2.
Figure 9:
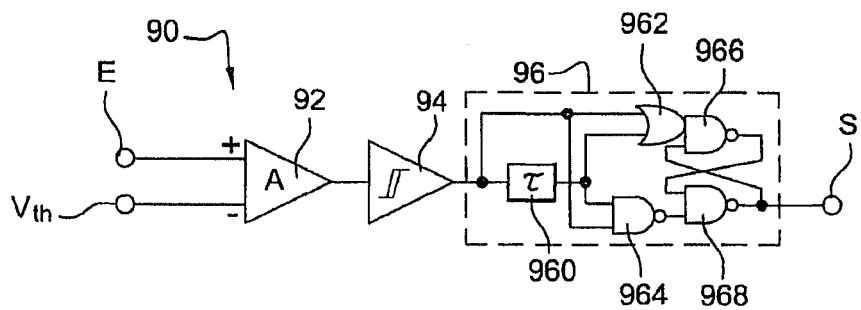
Figure 10:
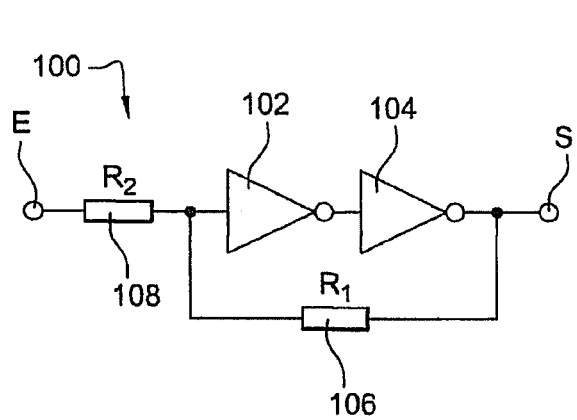
Figure 11:
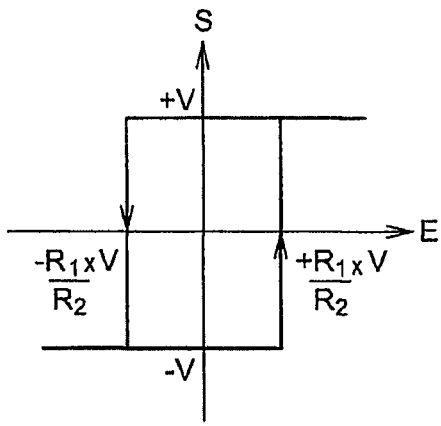
Figure 12:
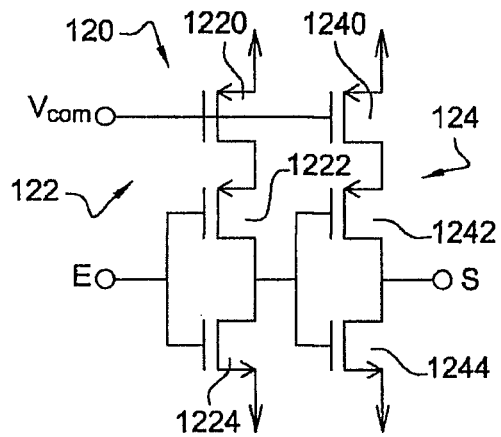
Figure 13:
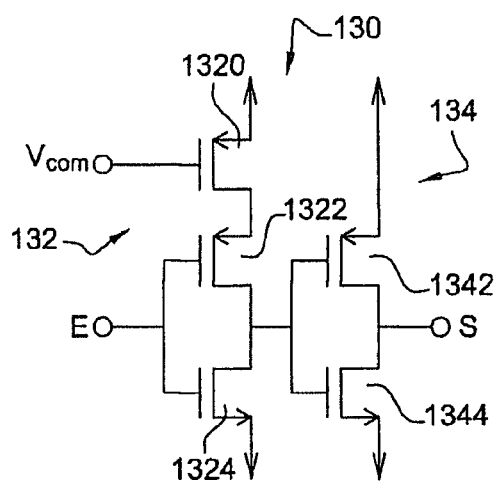
Figure 14:
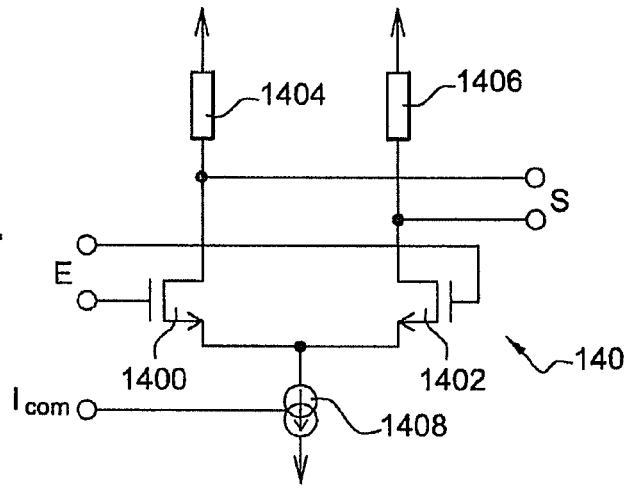
Figure 15:
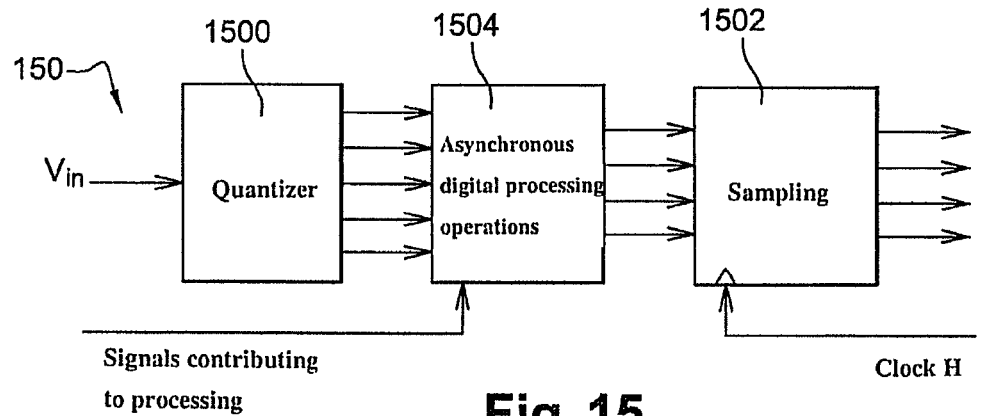
Figure 16:
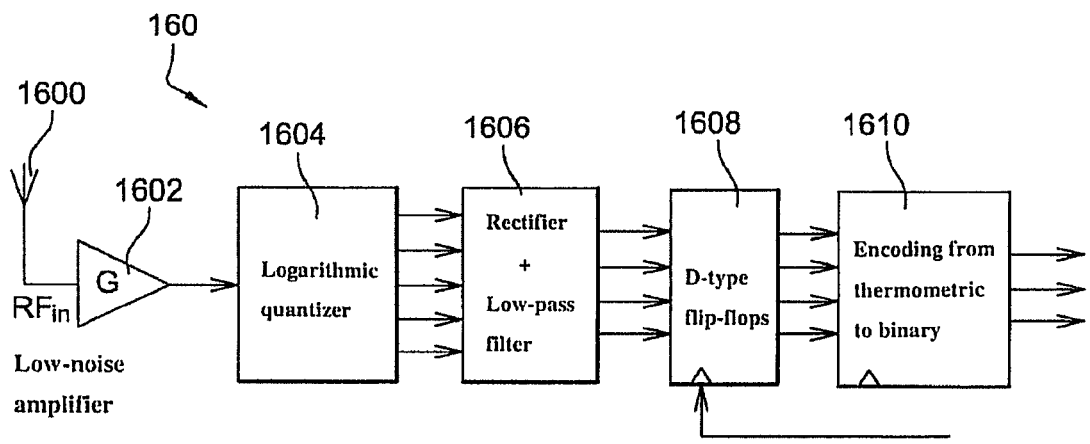
Figure 17:
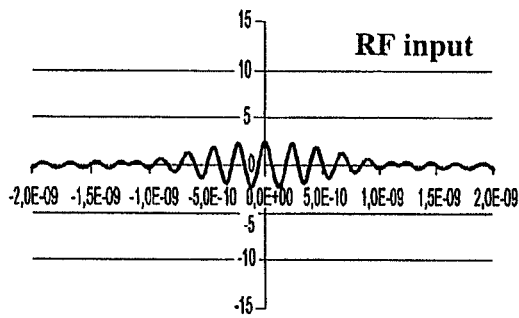
Figure 18:
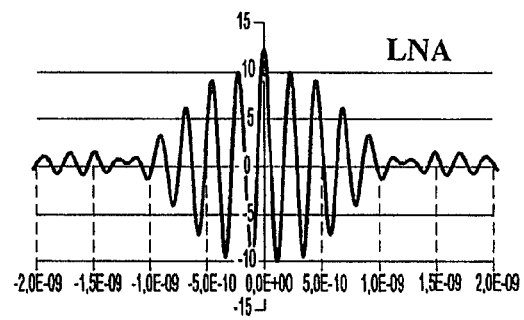
Figure 19:
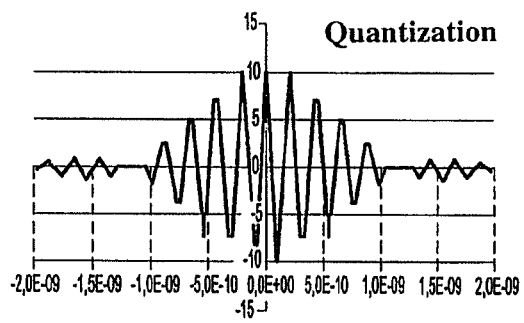
Figure 20:
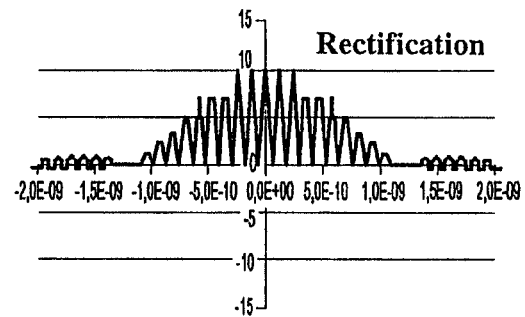
Figure 21:
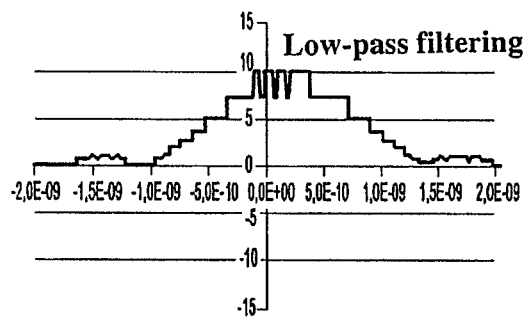
Figure 22:
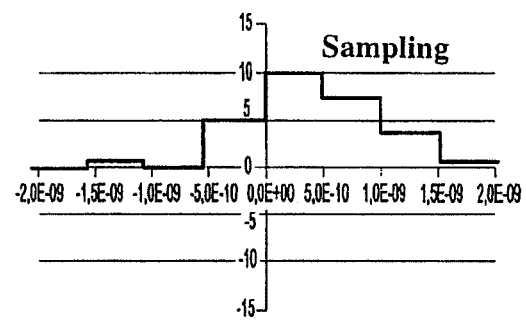

FIG. 8 is a diagrammatic view of a second embodiment 80 of an amplifier $G_1^2 \text{-} G_{2^N-1}^2$.

According to this embodiment, the amplifier 80 comprises two identical amplification cells 82, 84 arranged in series. Each cell 82, 84 comprises an inverter 820, 840 of gain A, and is constituted by the output thereof. The cell 82, 84 also comprises a first impedance 822, 842 of value $Z_1$, connected between the input and the output of the inverter 820, 840, and a second impedance 824, 844 of value $Z_2$, connected at one of its terminals to the input of the inverter 822, 842, and whereof the other terminal constitutes the input of the cell 82, 84. The transfer function between the output S and the input E of the amplifier 80 is thus given by the relation:

$$\frac{S}{E} = \left( \frac{A \times Z_1}{Z_1 + (1+A) \times Z_2} \right)^2$$

The values $Z_1$ and $Z_2$ of the impedances are selected in a similar way to the embodiment described in relation to FIG. 7.

This second embodiment is advantageous since we have here access to the inverted signal, which gives a comparison on the positive and negative half-waves of the signal without having to change either the comparators or the comparison thresholds. The inverter is in fact the most straightforward of inverting amplifiers.

An operational amplifier is not therefore justified particularly because of the DC filtering. To do this, a comparator may be added at the output of each cell 82 or a single inverting cell (82 or 84) may be used for each amplifier.

Figure 9:
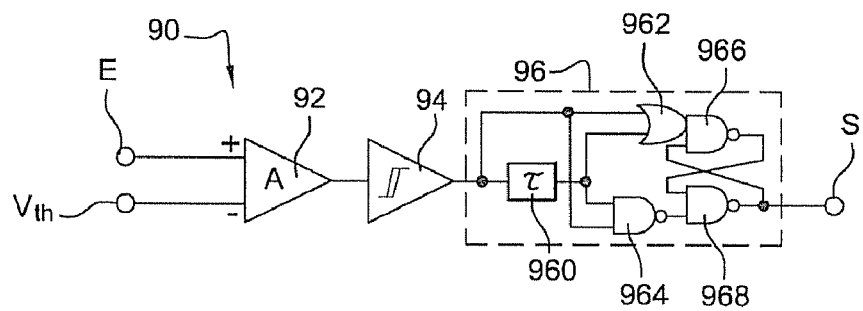
FIG. 9 is a diagrammatic view of a comparator forming a constituent part of the quantizer in FIG. 2.

In FIG. 9, an embodiment 90 is shown of a comparator $C_1^2$-$C_{2^N-1}^2$ of the quantizer in FIG. 2.

The comparator 90 includes a differential amplifier 92 of gain A, receiving on its positive terminal (+) the output of the amplifier $G_1^2$-$G_{2^N-1}^2$, 24 with which it is associated, and on its negative terminal (−) the threshold voltage $V_{th}$.

The comparator 90 also comprises a discriminator with hysteresis 94, connected at the output of the differential amplifier 92. The discriminator 94 makes the binary decision as to whether the voltage on the terminal (+) is greater than the voltage on the terminal (−) of the amplifier 92 by supplying at output a correctly saturated signal.

Lastly, as an option, the comparator 90 comprises a peak detecting low-pass filter 96, connected at the output of the discriminator 94.

This filter 96 comprises a delay cell 960, connected at the output of the discriminator 94, and applying a delay of predetermined value τ to the voltage it receives at input. The filter 96 also comprises "OR" logic 962 and "NAND" logic 964 gates, each connected at the output of the discriminator 94 and of the delay cell 960, and a low-level sensitive RS flip-flop constituted by two interconnected "NAND" gates 966, 968.

The filter 96 thus eliminates pulses of a duration less than the delay τ. The value of τ is preferably chosen in such a way that its inverse is greater than or equal to the Shannon frequency of the voltage $V_{in}$ to be quantized. Thus, by means of the filter 96, interference pulses, such as might be caused for example by high-frequency interference, are substantially eliminated.

Figure 10:
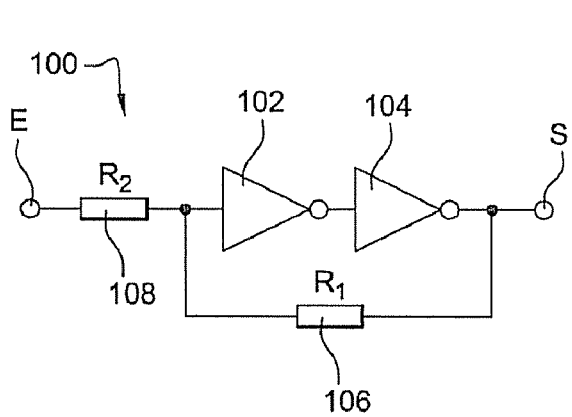
FIGS. 10 and 11 show a discriminator with hysteresis forming a constituent part of the comparator in FIG. 9.
Figure 11:
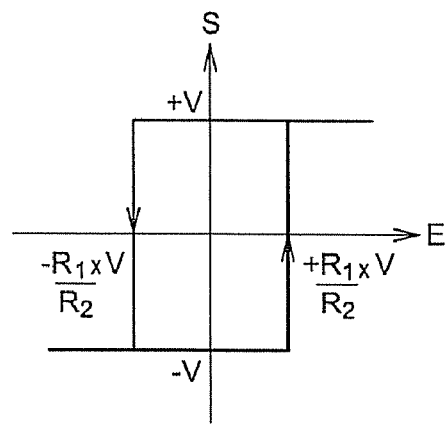

FIG. 10 is an example of an embodiment 100 of the discriminator 94 and FIG. 11 is a hysteresis implemented by this embodiment of the discriminator 94.

The discriminator 100 comprises two logic inverters 102, 104 in series, a first resistance 106 of value $R_1$ connected in parallel with the two inverters 102, 104, and a second resistance 108 of value $R_2$, connected at the input of the first inverter 102. The free terminal of the second resistance 108 constitutes the input E of the discriminator 100 and the output of the second inverter constitutes the output S thereof.

As can be seen in FIG. 11, the hysteresis voltage is substantially equal to $$V \times \frac{R_1}{R_2},$$

where V is the half-amplitude of the binary outcome, where 2V is the supply voltage of the inverters 102, 104, in other words also the output amplitude thereof.

Figure 12:
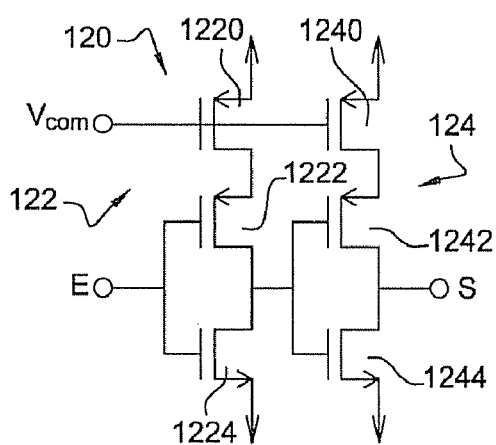
FIGS. 12 to 14 are diagrammatic views of different embodiments of delay cells forming a constituent part of the quantizer in FIG. 2.
Figure 13:
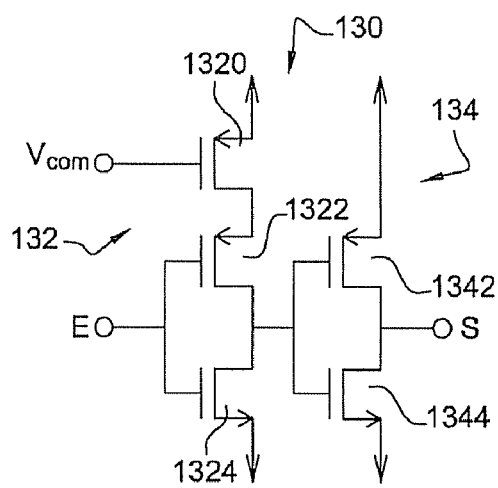
Figure 14:
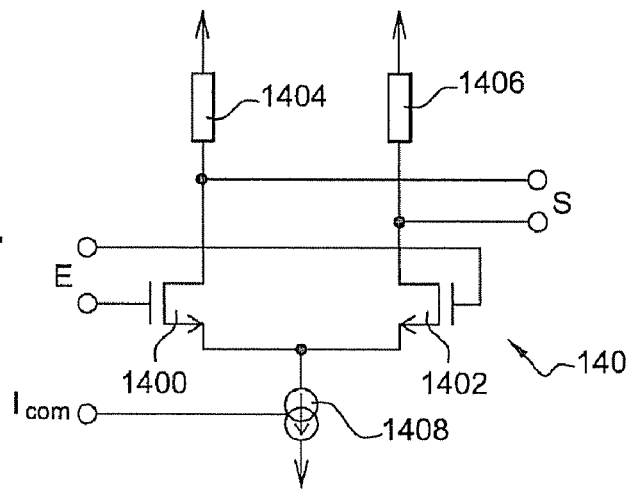

FIGS. 12 to 14 are diagrammatic views of embodiments 120, 130 and 140 of delay cells $D_1^2$-$D_{2^N-1}^2$.

The cell 120 in FIG. 12 comprises two branches 122, 124 of MOS transistors. Each branch is constituted by:
  a first p-channel MOS transistor 1220, 1240, whereof the source is connected to the earth and whereof the gate is connected to a voltage $V_{com}$ for adjusting the delay of the cell 120,
  a second p-channel MOS transistor 1222, 1242, whereof the source is connected to the drain of the first MOS transistor 1220, 1240,
  and an n-channel MOS transistor 1224, 1244, whereof the drain is connected to the drain of the second MOS transistor 1222, 1242 and whereof the source is connected to the earth.

The gates of the second p-channel MOS transistor 1222 and of the n-channel transistor 1224 of the first branch 122 are common and are connected to the input E of the cell 120. The gates of the second p-channel MOS transistor 1242 and of the n-channel transistor 1244 of the second branch 122 are common and are connected to the output S of the cell 120.

The delay cell 130 in FIG. 13 is identical to that in FIG. 12 except that the first p-channel MOS transistor of the second branch is omitted.

The cell 120 in FIG. 12 delays both the rising edges and the falling edges of a signal applied to the input E, whereas the cell 130 in FIG. 13 delays only the falling edges.

Furthermore, the effect of the presence of the additional MOS transistor 1240 in the cell 120 is to reduce the switch current of the transistors as a function of the adjustment voltage Vcom.

The delay cell 140 in FIG. 14 comprises for its part two n-channel MOS transistors 1400, 1402, having their sources in common, two capacitors 1404, 1406 connected between the drains of the transistors 1400, 1402 and the earth respectively, and a current source 1408 connected between the sources of the transistors 1400, 1402 and the earth. The input E of the cell 140 is connected to the gates of these transistors and the output S to the drains thereof. The value of the delay applied by the cell 140 is adjusted by the value of the current $I_{com}$ from the current source 1408.

The cell 140 offers a higher operating speed than that of the cells 120, 130 in FIGS. 12 and 13, but requires the polarization current $I_{com}$ on a permanent basis.

Analogue-to-Digital Converter According to the Invention

Figure 15:
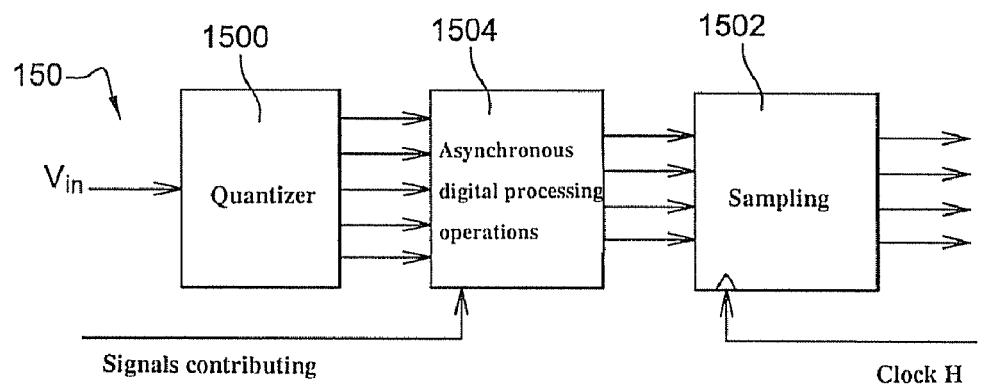
FIG. 15 is a diagrammatic view of an inventive ADC.

FIG. 15 is a diagrammatic view of an analogue-to-digital converter 150 that incorporates an inventive quantizer.

The ADC comprises an inventive quantizer 1500, for example the one in FIG. 2, and a sampler 1502, whereof the sampling frequency is that of a clock H. The sampler is for example constituted by a register of $2^N-1$ D-type flip-flops.

In a particularly advantageous way, the ADC 150 also includes an asynchronous digital processing circuit 1504, arranged between the quantizer 1500 and the sampler 1502, and implementing any operation deemed useful on the quantized signal.

The quantized values of the voltage $V_{in}$ are thus processed before sampling. This is made possible by the fact that the inventive quantizer is asynchronous by nature given the signal propagation delays along the amplifier chain.

Conventionally, in the case of a flash ADC, a processing operation is performed on the quantized and sampled values at the output thereof. But, it is known that a processing operation on such values in reality requires the sampled values to be reconverted into digital values to allow logic operations. Processing in respect of the non-sampled quantized values thereby allows this step to be saved, involving in fact an operation speed and consumption gain.

Clearly, it is also possible to provide for no digital processing of the quantized values before the sampling thereof. In such a scenario, the quantizer is directly connected to the sampler.

Application to Ultra-Wide Band Pulse Reception

The radio transmission of digital or analogue information is commonly implemented by converting this information by modulation into a signal, whereof the frequency domain, constituted by one or more high-frequency bands, is compatible with transmission by radio wave (RF). This transmission is performed without wire support, and in general in a transmission channel which is constituted by the environment (air or vacuum for example) located between the sender and the receiver of the RF signal. Once received, the RF signal is demodulated to retrieve the initial information in the frequency base band thereof.

At least two types of RF transmission may be distinguished, namely a transmission by modulated carrier and a transmission by pulse signals, for example of the radar type.

In the case of a transmission by modulated carrier, the RF signal is produced by combining one or more modulated sinusoidal signals, which have the particular feature of being sent during most of, if not throughout the entire length of the transmission. The RF signal is therefore sent continuously.

In the case of an RF transmission by pulse signals, the RF signal is a modulated pulse, generally of short duration relative to the total length of transmission, but regularly repeated. Sending is therefore performed discontinuously. Since short pulses occupy a very wide frequency spectrum, we often talk about ultra-wide band (UWB) pulse transmission.

Today, many RF transceivers are designed to send digital information rather than analogue information on account of the ever greater possibilities offered by digital signal processing. It can thus be seen, in an RF receiver, that an analogue-to-digital conversion is performed as soon as possible after reception, sometimes even at the output of the receiving antenna, in order to benefit as quickly as possible from the advantages offered by digital processing.

However, placing an analogue-to-digital converter as close as possible to the antenna of the RF receiver, in other words upstream from the demodulation components which convert the signal in the base band, compels, except in very special sub-sampling scenarios, sampling at least twice the highest frequency of the spectrum of the RF signal received. In fact, a sampling at very high frequency (of the order of several gigahertz) involves on the one hand the use of very fast converters, commonly flash ADCs, and on the other hand a digital demodulation from a very large data flow (of the order of a gigabyte a second).

Such RF receivers have not thus far proved satisfactory, particularly in terms of consumption.

Furthermore, in the case of non-coherent UWB detection by detecting the energy of the pulses of the RF signal received, as described for example in the document WO 2005/074150, the instantaneous power of the RF signal received is approximated by measuring the absolute value of this signal by rectification thereof.

In fact, an effective rectification is obtained for a signal of sufficiently large amplitude. It is thus necessary to provide in the UWB receiver, non-coherent by energy detection, a strong amplification of the amplitude of the signal received, and typically an amplification of about 70 dB. A part of the amplification gain is commonly obtained by the low-noise amplifier, and typically a gain of about 20 dB. The remainder of the amplification is implemented using specific amplifier stages.

Figure 16:
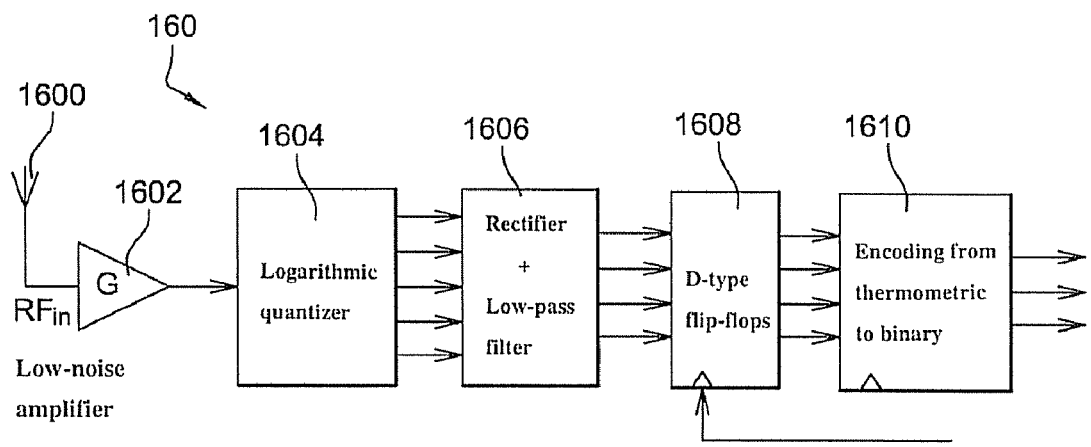
FIG. 16 is a diagrammatic view of an inventive ultra-wide band receiver.
Figure 17:
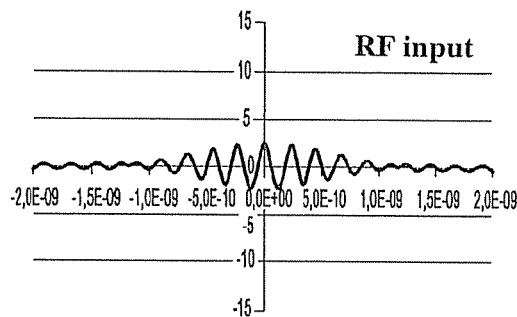
FIGS. 17 to 22 are timing diagrams showing the different processing steps implemented by the rectifier ADC in FIG. 16.
Figure 18:
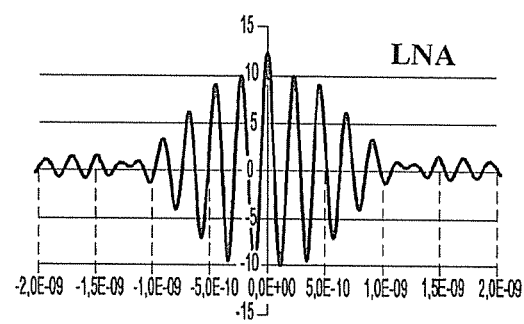
Figure 19:
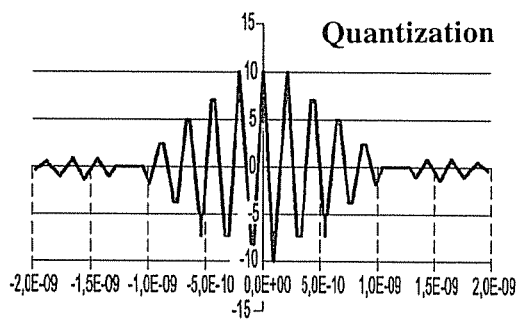
Figure 20:
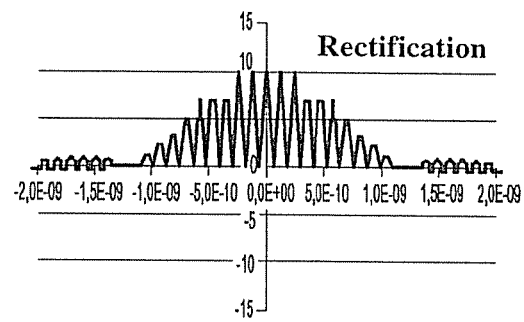
Figure 21:
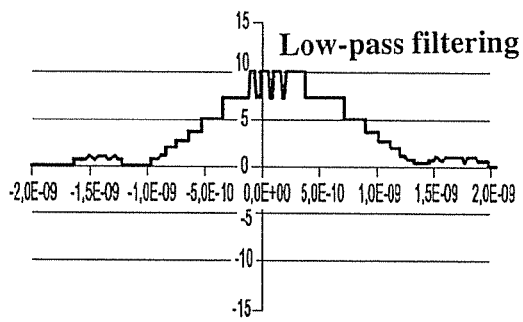
Figure 22:
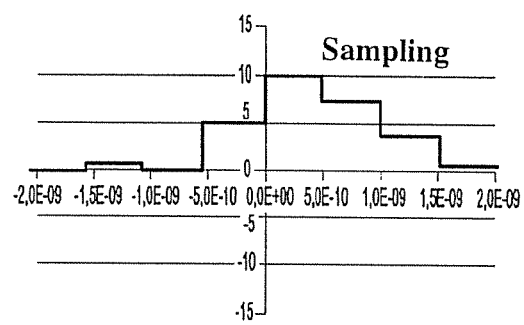

FIG. 16 is a diagrammatic view of a UWB receiver 160 non-coherent by energy detection. This receiver 160 comprises an ADC according to the invention. This ADC resolves both the energy consumption problem and the problem of sampling at very high frequency through the use of an inventive quantizer, since it does not require much energy and allows the quantization function to be separated from the sampling function.

The UWB receiver 160 comprises a conventional RF receiving antenna 1600 and a conventional low-noise amplifier 1602.

The receiver 160 further comprises a logarithmic compression quantizer 1604 according to the invention, as described in relation to FIG. 2. The quantizer 1604 is connected to the amplifier 1602 and quantizes the amplified RF signal at the output thereof.

A module 1606, applying a rectification and filtering and low-pass function, is also provided at the output of the quantizer 1604.

The rectification implemented by the module 1606 comprises for example adjusting the sign of the quantized signal to 0.

The low-pass filtering of the module 1606, for example in the form of a finite or infinite impulse response filter, substantially reduces the pass band of the quantized signal so as to lower the sampling frequency subsequently implemented by one order of magnitude. Only the received signal envelope is thus retained, in other words the useful part thereof.

Furthermore, a sampler 1608, constituted by a register with $2^N-1$ D-type one-shot flip-flops, is connected at the output of the low-pass filter in order to sample the quantized values delivered thereby.

Lastly, a thermometric encoder 1610, connected to the sampler 1608, encodes the quantized and sampled values at the output thereof, according to a desired binary coding, such as a Gray coding for example.

FIGS. 17 to 22 show the different processing steps implemented by the receiver 160 on an example of pulses received, in this case of the square root raised cosine type at a centre frequency of 4.5 GHz and having a frequency band of 700 MHz. The sampling frequency in this case is 2 GHz.

Figure 23:
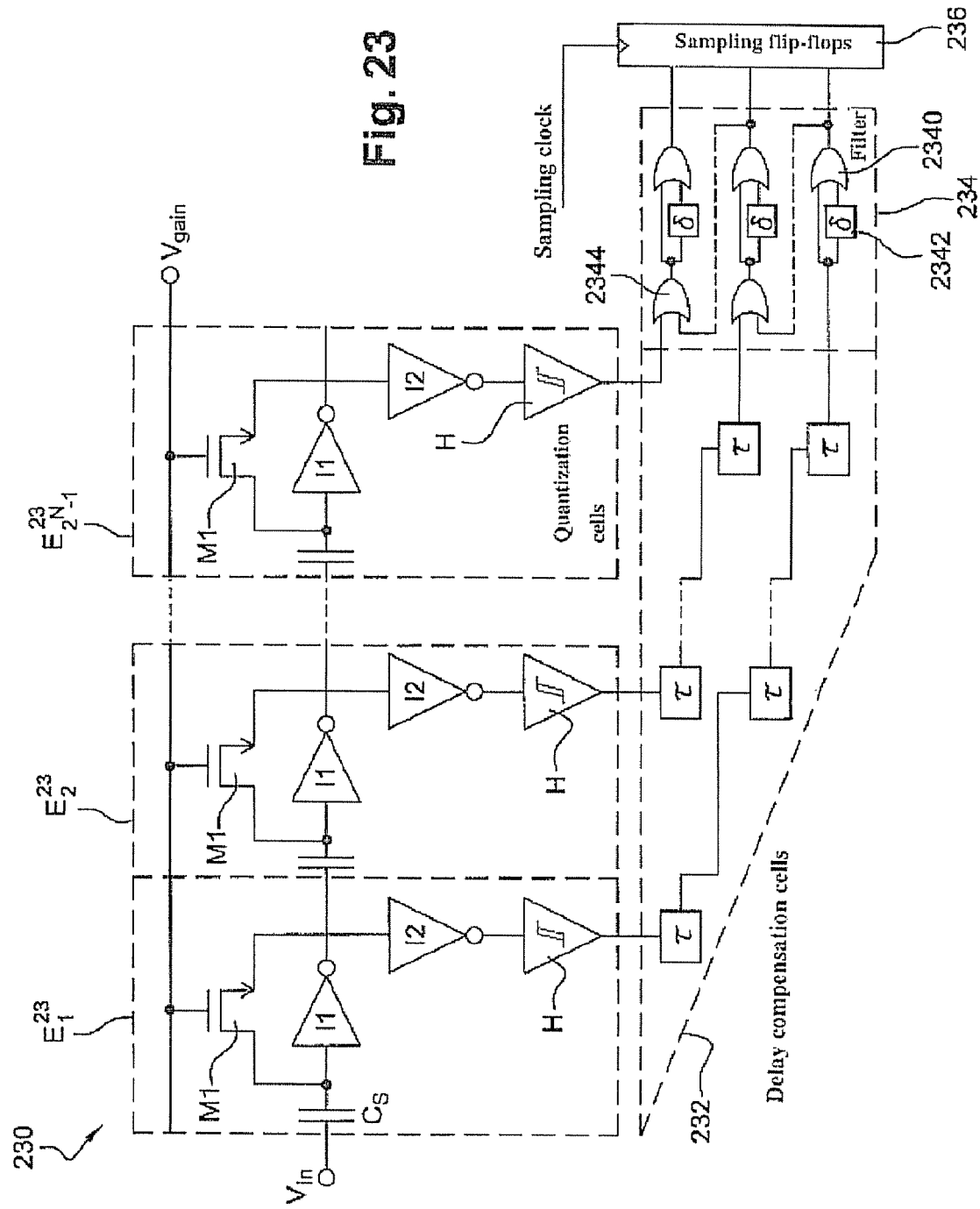
FIG. 23 is a particular embodiment of the receiver in FIG. 16.
Figure 1:
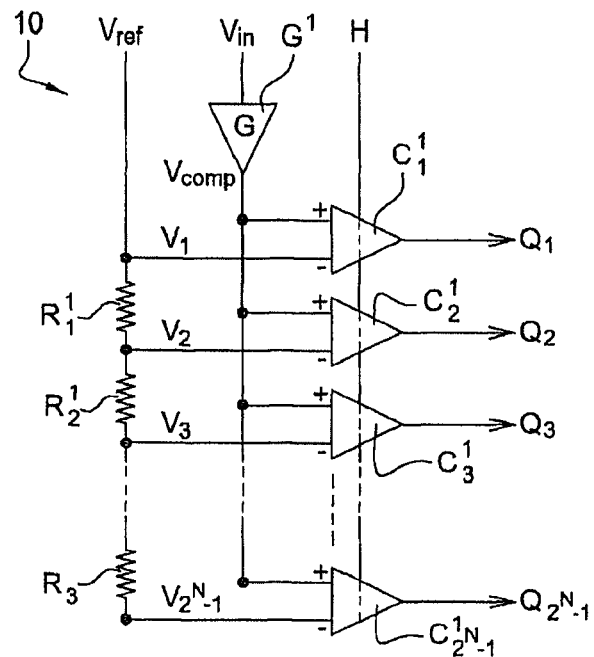
Figure 2:
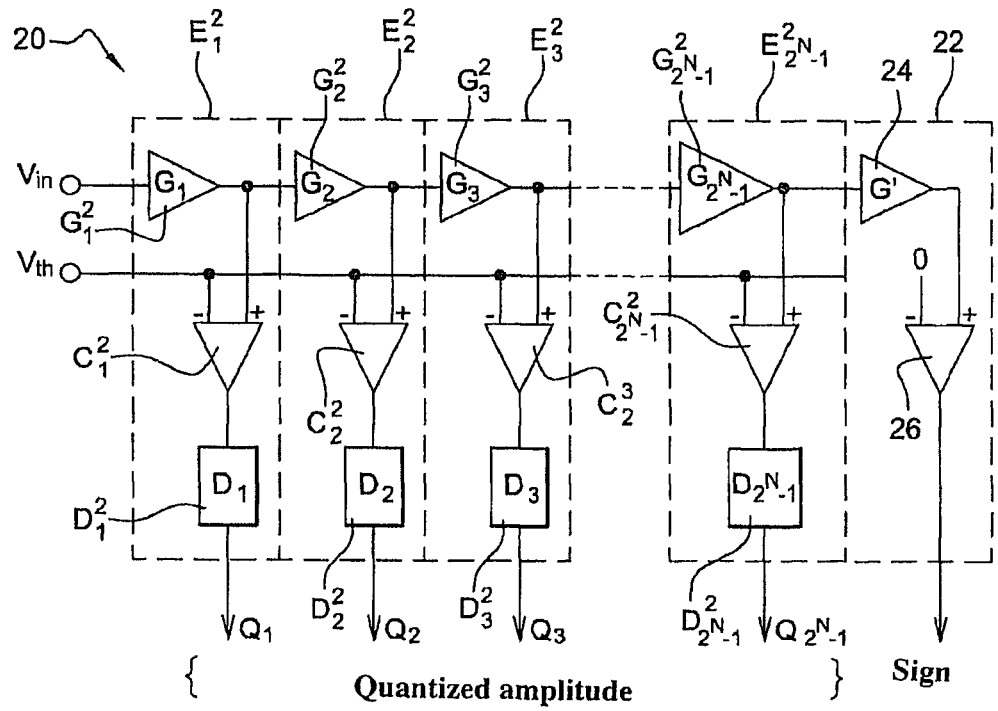

FIG. 23 is another embodiment of the quantizer 1604, of the rectification and low-pass filtering 1606 and sampling 1608 module of the receiver 160 in FIG. 16.

In this embodiment, the quantizer, here given the reference number 230, is constituted by $2^N-1$ quantization stages $E_1^{23}$-$E_{2^N-1}^{23}$ arranged in series and by a triangular matrix 232 of delay cells of value τ.

Each of these stages $E_1^{23}$-$E_{2^N-1}^{23}$ comprises a first CMOS inverter I1, whereof the output constitutes the output of the stage, an n-channel CMOS transistor M1 and a capacitor Cs, connected at one of its terminals to the input terminal of the inverter I1 and whereof the other terminal constitutes the input of the quantization stage $E_1^{23}$-$E_{2^N-1}^{23}$.

The capacitor Cs filters a parasitic DC component of the signal $V_{in}$ to be quantized. Indeed, in the context of the application to UWB reception, the signal comprises no DC component when it is not subject to interference.

The drain-to-source path of the transistor M1 is assembled in negative feedback on the first inverter I1, and the gate of the transistor M1 is connected to a control voltage Vgain. The value of the gate voltage Vgain of the transistor M1 adjusts the amplification gain produced by the amplifier stage, a gain which in this case is negative.

Each quantization stage $E_1^{23}$-$E_{2^N-1}^{23}$ further comprises a second CMOS inverter I2, connected at the output of the first inverter I1. The second inverter I2 is chosen to be different from the first inverter I1 in such a way that the inverter I2 amplifies the output of the first inverter I1 with a predetermined voltage bias. This bias corresponds to the threshold voltage $V_{th}$ required for the quantization implemented by the quantization stage $E_1^{23}$-$E_{2^N-1}^{23}$. This is for example achieved by choosing transistors of different size for the inverters I1 and I2.

Lastly, each quantization stage $E_1^{23}$-$E_{2^N-1}^{23}$ includes a discriminator with hysteresis H, for example the one described in relation to FIG. 10.

The triangular matrix 232 comprises for its part a series of consecutive delay cells for each quantization stage $E_1^{23}$-$E_{2^N-1}^{23}$, the number of consecutive delay cells for the $i^{th}$ quantization stage being equal to $2^N-1-i$, so as to compensate the propagation time in the stages $E_1^{23}$-$E_{2^N-1}^{23}$.

The quantizer 230 further comprises a filter 234. The filter 234 performs, in combination with the quantization stages $E_1^{23}$-$E_{2^N-1}^{23}$, a rectification function.

To be more specific, assuming the gains to be equal to $-G$ for the quantization stages $E_1^{23}$-$E_{2^N-1}^{23}$, with G a predetermined positive number, a comparison is made using the odd-numbered quantization stages $E_1^{23}, E_3^{23}, \ldots, E_{2^N-1}^{23}$ of the voltage $V_{in}$ to be quantized (the voltage at the low-noise amplifier output) with the values $$\left\{-\frac{V_{th}}{G^{2^N-1}}, \ldots, -\frac{V_{th}}{G^3}, -\frac{V_{th}}{G}\right\}.$$

Furthermore, a comparison is made using the even-numbered quantization stages $E_2^{23}, E_4^{23}$, to $E_{2^N-2}^{23}$ of the voltage $V_{in}$ with the values $$\left\{\frac{V_{th}}{G^{2^N-2}}, \ldots, \frac{V_{th}}{G^4}, \frac{V_{th}}{G^2}\right\}.$$

In fact, the odd-numbered stages quantize the absolute value of the negative half-waves of the voltage $V_{in}$ whereas the even-numbered stages quantize the absolute value of the positive half-waves of the voltage $V_{in}$. An interlaced quantization of the positive and negative half-waves of the voltage $V_{in}$ is thus obtained.

The filter 234 also implements a low-pass filtering by peak detection. This filtering is performed by extending, by a predetermined period of time δ, each quantized value $Q_1$-$Q_{2^N-1}$ at the output of the matrix 232. For each of the quantized values $Q_1$-$Q_{2^N-1}$, the filter 234 comprises to this end an "OR" gate 2340 through which the quantized value is combined with a value of itself delayed using a delay cell 2342 of value δ.

The filter 234 also combines, using "OR" gates 2344, the extended quantized values associated with two consecutive quantization stages. For example, by denoting as $Q_1'$-$Q_{2^N-1}'$ the extended quantized values, the filter 234 produces, apart from for the first extended quantized value $Q_1'$, the logic combinations $Q_i''=Q_i'$ OU $Q_{i+1}'$. A rectification of the quantized negative half-waves of the voltage $V_{in}$ is thus obtained. Lastly, a sampler 236 is also provided to sample the quantized, extended and rectified values at the output of the filter 234.

Although a quantizer has been described with a unique threshold value, it will be understood that it is possible to choose different values for the comparison.

The invention claimed is:

1. An N-bit asynchronous quantizer including:
   $2^N-1$ signal amplifier stages ($G_1^2$-$G_{2^N-1}^2$; I1, Cs, M1) arranged in series, the input of the first stage being capable of receiving a signal to be quantized;
   $2^N-1$ comparators ($C_1^2$-$C_{2^N-1}^2$; I2, H), one comparator being connected to the output of each amplifier stage ($G_1^2$-$G_{2^N-1}^2$; I1, Cs, M1), and capable of comparing the value of this output with a predetermined threshold value; and
   at least $2^N-2$ delay lines ($D_1^2$-$D_{2^N-1}^2$) placed at the output of the $2^N-2$ first comparators, the signals supplied at the output of the delay lines ($D_1^2$-$D_{2^N-1}^2$) and of the last comparator constituting at any instant the quantized binary values of the input signal with a time shift,
   wherein the quantizer further comprises, at the start or at the end of the amplifier stage sequence, an additional amplifier stage, and an additional comparator connected to the output of the additional amplifier stage and capable of comparing the output thereof with the zero value in order to determine the sign of the signal to be quantized.

2. The quantizer as claimed in claim 1, wherein the absolute value of the gain of an amplifier stage ($G_1^2$-$G_{2^N-1}^2$; I1, Cs, M1) is between about 1 and about 2.

3. The quantizer as claimed in claim 1, wherein the gain of the amplifier stages ($G_1^2$-$G_{2^N-1}^2$; I1, Cs, M1) is substantially identical.

4. The quantizer as claimed in claim 1, wherein the absolute value of the gain of an amplifier stage ($G_1^2$-$G_{2^N-1}^2$; I1, Cs, M1), apart from the first one, is substantially equal to $i/(i-1)*G1$, where G1 is the gain of the first amplifier stage and i is the position of the amplifier stage in the amplifier stage sequence.

5. The quantizer as claimed in claim 1, wherein the gain of the amplifier stages is negative.

6. The quantizer as claimed in claim 1, wherein an amplifier stage ($G_1^2$-$G_{2^N-1}^2$; I1, Cs, M1) is also arranged to filter the DC component of the signal to be quantized.

7. The quantizer as claimed in claim 1, wherein each amplifier stage ($G_1^2$-$G_{2^N-1}^2$; I1, Cs, M1) is of the automatic gain control type.

8. The quantizer as claimed in claim 1, wherein each amplifier stage ($G_1^2$-$G_{2^N-1}^2$) comprises:
   a differential amplifier, whereof a positive input constitutes the input of the amplifier stage;
   a first impedance connected between a negative input and an output of the differential amplifier; and
   a second impedance connected between the negative input of the differential amplifier and the earth.

9. The quantizer as claimed in claim 1, wherein each amplifier stage ($G_1^2$-$G_{2^N-1}^2$) comprises a series arrangement of two amplifier cells, each of the cells consisting of:
   an inverter, whereof the output constitutes the output of the cell,
   a first impedance connected between the input and the output of the inverter, and
   a second impedance connected at one of its terminals to the input of the inverter, and whereof the other terminal constitutes the input of the cell.

10. The quantizer as claimed in claim 1, wherein each amplifier stage (I1, Cs, M1) comprises:
    an inverter (I1), whereof the output constitutes the output of the amplifier stage, a first impedance (M1) connected between the input and the output of the inverter (I1), and a second impedance (Cs) connected at one of its terminals to the input of the inverter, and whereof the other terminal constitutes the input of the stage.

11. The quantizer as claimed in claim 5, wherein it further comprises a digital processing module capable of applying an "OR" function to each pair of consecutive outputs of the delay lines and of the last comparator, the "OR" function outcome constituting a quantized binary value.

12. The quantizer as claimed in claim 8, wherein the DC value of the second impedance is substantially greater than the DC value of the first impedance.

13. The quantizer as claimed in claim 8, wherein the first impedance (M1) is the one defined between the drain and the source of an MOS transistor.

14. The quantizer as claimed in claim 1, wherein the threshold value is unique for all the comparators ($C_1^2$-$C_{2^N-1}^2$; I2, H).

15. The quantizer as claimed in claim 1, wherein each comparator ($C_1^2$-$C_{2^N-1}^2$) comprises:
- a high-gain differential amplifier receiving on a positive input the output of the corresponding amplifier stage, and on a negative input the corresponding threshold value, and
- a binary decision-making module connected at the output of the high-gain differential amplifier.

16. The quantizer as claimed in claim 15, wherein the binary decision-making module includes a discriminator with hysteresis.

17. The quantizer as claimed in claim 15, wherein it further comprises a filtering module connected at the output of the binary decision-making module in order to eliminate pulses of duration less than a predetermined duration.

18. The quantizer as claimed in claim 1, wherein each delay line comprises $2^N-1-i$ of the substantially identical delay cells, where i is the position of the amplifier stage (I1, M1, Cs) associated with the delay line in the amplifier stage sequence.

19. A N-bit analogue-to-digital converter including a quantizer as claimed in claim 1, wherein a sampler is connected to the quantizer and capable of sampling the signals it receives at input.

20. The analogue-to-digital converter as claimed in claim 19, wherein it comprises a digital processing module connected between the quantizer and the sampler.

21. A receiver of a radiofrequency signal of the type with a built-in converter as claimed in claim 19.

22. The receiver of a radiofrequency signal as claimed in claim 21, wherein the quantizer implements a quantization with logarithmic compression.

23. The receiver of a radiofrequency signal as claimed in claim 21, wherein the received signal to be quantized is a radiofrequency modulated carrier signal.

24. The receiver of a radiofrequency signal as claimed in claim 21, wherein the received signal to be quantized is an ultra wide band signal.

25. A receiver of a radio frequency signal, comprising an N-bit asynchronous quantizer including:
- $2^N-1$ signal amplifier stages ($G_1^2$-$G_{2^N-1}^2$; I1, Cs, M1) arranged in series, the input of the first stage being capable of receiving a radiofrequency signal to be quantized;
- $2^N-1$ comparators ($C_1^2$-$C_{2^N-1}^2$; I2, H), one comparator being connected to the output of each amplifier stage ($G_1^2$-$G_{2^N-1}^2$; I1, Cs, M1), and capable of comparing the value of this output with a predetermined threshold value; and
- at least $2^N-2$ delay lines ($D_1^2$-$D_{2^N-1}^2$) placed at the output of the $2^N-2$ first comparators, the signals supplied at the output of the delay lines ($D_1^2$-$D_{2^N-1}^2$) and of the last comparator constituting at any instant the quantized binary values of the input signal with a time shift; wherein the quantizer further comprises, at the start or at the end of the amplifier stage sequence, an additional amplifier stage, and an additional comparator connected to the output of the additional amplifier stage and capable of comparing the output thereof with the zero value in order to determine the sign of the signal to be quantized.

* * * * *

UNITED STATES PATENT AND TRADEMARK OFFICE
CERTIFICATE OF CORRECTION

PATENT NO.         : 8,077,068 B2
APPLICATION NO.    : 12/730435
DATED              : December 13, 2011
INVENTOR(S)        : LaChartre It is certified that error appears in the above-identified patent and that said Letters Patent is hereby corrected as shown below:

Delete the title page and substitute therefore the attached title page.

Delete drawing sheets 1-6 and substitute therefore the attached drawing sheets 1-6.

Delete the entire specification and claims and replace with the attached reprinted specification and claims.

Signed and Sealed this
Third Day of July, 2012

David J. Kappos
*Director of the United States Patent and Trademark Office*

CERTIFICATE OF CORRECTION (continued)

(12) United States Patent
LaChartre

(10) Patent No.: US 8,077,068 B2
(45) Date of Patent: Dec. 13, 2011

(54) QUANTIZER, ANALOGUE-TO-DIGITAL CONVERTER COMPRISING SUCH A QUANTIZER, AND ULTRA-WIDE BAND RECEIVER INTEGRATING SUCH A CONVERTER

(75) Inventor: David LaChartre, Montbonnot (FR)

(73) Assignee: Commissariat A l'Energie Atomique et Aux Energies Alternatives, Paris (FR)

( * ) Notice: Subject to any disclaimer, the term of this patent is extended or adjusted under 35 U.S.C. 154(b) by 0 days.

(21) Appl. No.: 12/730,435

(22) Filed: Mar. 24, 2010

(65) Prior Publication Data

US 2010/0176982 A1    Jul. 15, 2010

Related U.S. Application Data

(63) Continuation of application No. PCT/FR2008/051813, filed on Oct. 7, 2008.

(30) Foreign Application Priority Data

Oct. 12, 2007   (FR) .................................. 07 58284

(51) Int. Cl.
*H03M 1/12* (2006.01)

(52) U.S. Cl. ........ 341/155; 341/118; 341/120; 341/158; 341/159; 341/161

(58) Field of Classification Search .......... 341/118–120, 341/143, 155, 161
See application file for complete search history.

(56) References Cited

U.S. PATENT DOCUMENTS

| | | | |
|---|---|---|---|
| 4,954,831 A * | 9/1990 | Ekins | 341/159 |
| 5,760,730 A | 6/1998 | Fischer et al. | |
| 5,892,474 A * | 4/1999 | Sugawara | 341/200 |
| 5,894,283 A * | 4/1999 | Fischer et al. | 341/161 |
| 6,037,891 A * | 3/2000 | Griph | 341/161 |
| 6,101,376 A * | 8/2000 | Bell | 455/218 |
| 6,480,132 B1 * | 11/2002 | Yoshioka et al. | 341/155 |
| 6,621,433 B1 * | 9/2003 | Hertz | 341/139 |
| 6,867,723 B1 * | 3/2005 | Tachibana et al. | 341/155 |
| 7,170,930 B2 * | 1/2007 | Denny et al. | 375/229 |
| 7,386,074 B1 * | 6/2008 | Venkatesh et al. | 375/345 |
| 7,733,260 B2 * | 6/2010 | Lee et al. | 341/155 |
| 7,786,918 B2 * | 8/2010 | Fukuzawa et al. | 341/155 |
| 7,868,665 B2 * | 1/2011 | Tumer et al. | 327/70 |

* cited by examiner

*Primary Examiner* — Linh Nguyen
(74) *Attorney, Agent, or Firm* — Burr & Brown

(57) ABSTRACT

The invention relates to an N-bit asynchronous Quantizer including a $2^N-1$ signal amplifier stages ($G_1^2$-$G_{2^N-1}^2$) arranged in series, the input of the first stage being capable of receiving a signal to be quantized; $2^N-1$ comparators ($C_1^2$-$C_{2^N-1}^2$), one comparator being connected to the output of each amplifier stage ($G_1^2$-$G_{2^N-1}^2$), and capable of comparing the value of this output with a predetermined threshold value; and at least $2^N-2$ delay lines ($D_1^2$-$D_{2^N-1}^2$) placed at the output of the $2^N-2$ first comparators, the signals supplied at the output of the delay lines ($D_1^2$-$D_{2^N-1}^2$) and of the last comparator constituting at any instant the quantized binary values of the input signal with a time shift.

25 Claims, 6 Drawing Sheets

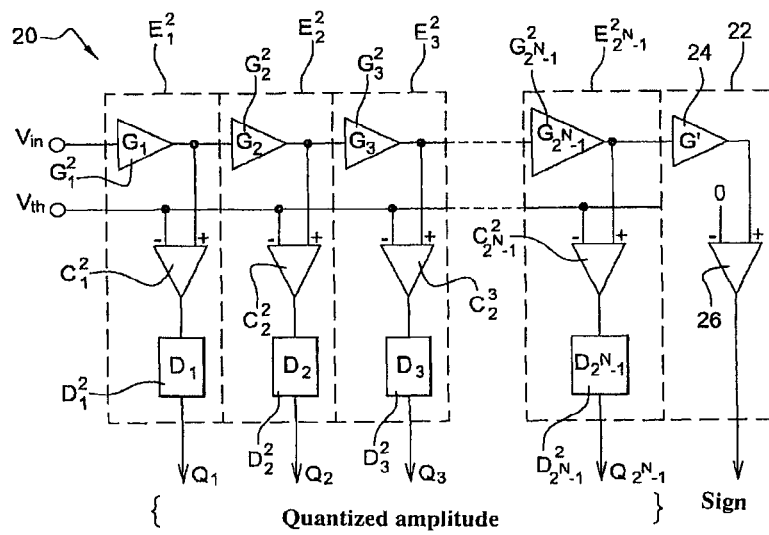

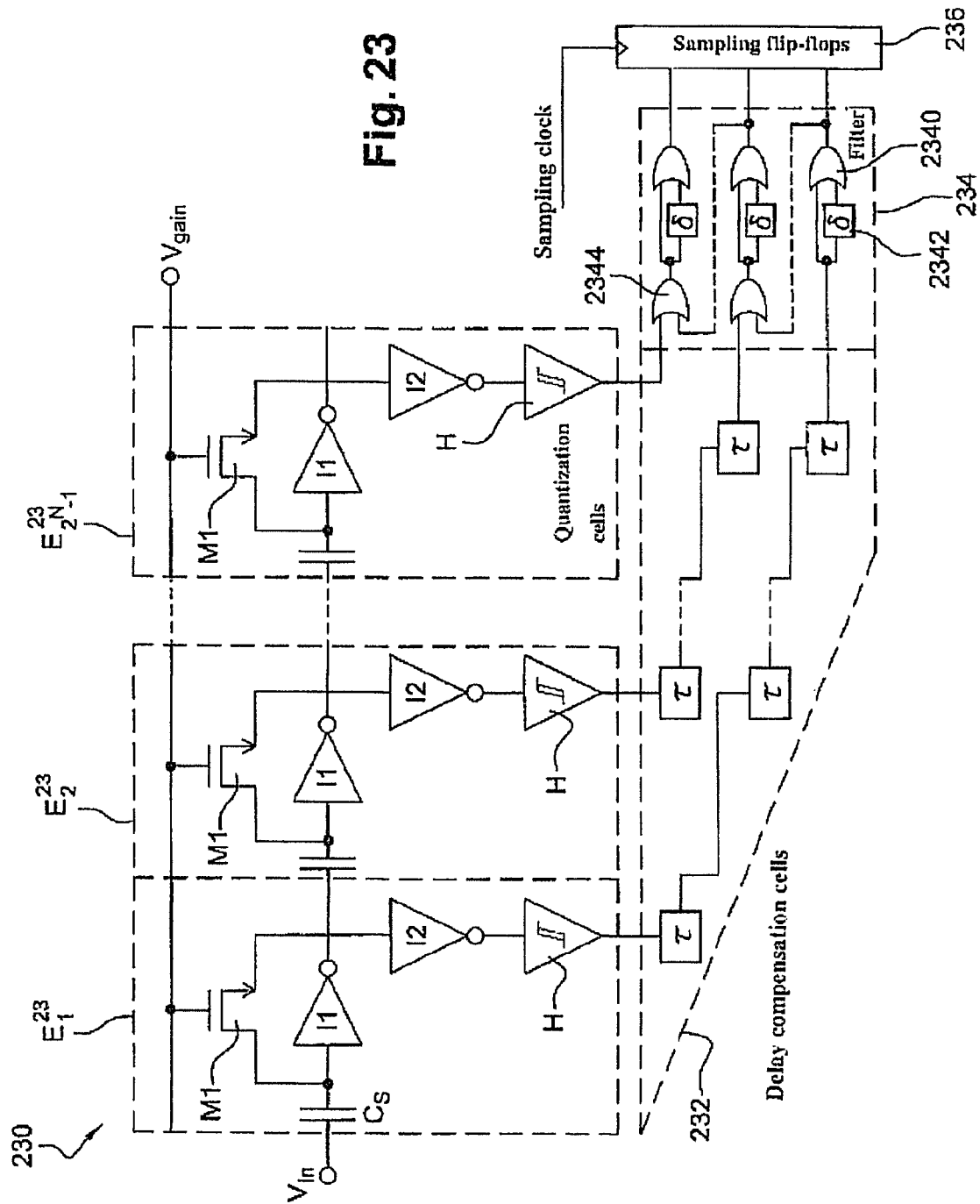

QUANTIZER, ANALOGUE-TO-DIGITAL CONVERTER COMPRISING SUCH A QUANTIZER, AND ULTRA-WIDE BAND RECEIVER INTEGRATING SUCH A CONVERTER

BACKGROUND OF THE INVENTION

The present invention relates to the field of analogue signal quantization, and to be more specific high-speed analogue signal quantization.

The present application can be used particularly in the reception of data transmitted in the form of a radio wave, and to be more specific in a reception of the ultra-wide band type.

PRIOR ART

Some applications, such as data transmission using radio waves for example, require analogue-to-digital conversion at very high speed, possibly reaching several gigasamples per second.

To this end, analogue-to-digital converters, or ADCs, of the flash type are commonly used on account of their conversion speed. The principle of an ADC of this type comprises comparing the signal for conversion with as many different voltages as there are conversion steps required.

An example of an N-bit flash ADC is given in diagram form in FIG. 1 under the general reference number 10. This ADC includes $2^N-1$ voltage comparators $C_1^1, C_2^1, C_3^1, \ldots, C_{2^N-1}^1$, an amplifier $G^1$, and $2^N-2$ resistances $R_1^1, R_2^1, R_3^1, \ldots, R_{2^N-1}^1$ connected in series between a reference voltage $V_{ref}$ and the earth.

The voltage amplifier $G^1$ receives at input and amplifies a voltage $V_{in}$ to be quantized and sampled, and is connected at output to each of the positive inputs (+) of the comparators $C_1^1, C_2^1, C_3^1, \ldots, C_{2^N-1}^1$ to which it delivers an amplified voltage $V_{amp}$.

The $2^N-2$ resistances $R_1^1, R_2^1, R_3^1, \ldots, R_{2^N-1}^1$ are of identical value R and constitute a voltage divider bridge defining $2^N-2$ voltages $V_2, V_3, \ldots, V_{2^N-1}$. The first comparator $C_1^1$ has its negative terminal (−) connected to the voltage $V_{ref}$ and the other comparators $C_2^1, C_3^1, \ldots, C_{2^N-1}^1$ have their negative terminal (−) connected to the voltages $V_2, V_3, \ldots, V_{2^N-1}$ respectively.

The amplified voltage $V_{amp}$ therefore attacks the comparators $C_1^1, C_2^1, C_3^1, \ldots, C_{2^N-1}^1$ in parallel and simultaneously, and is thus compared with $2^N-1$ threshold voltages $V_1=V_{ref}, V_2, V_3, \ldots, V_{2^N-1}$. The outputs of the comparators $C_1^1, C_2^1, C_3^1, \ldots, C_{2^N-1}^1$ thereby define the quantized binary values $Q_1, Q_2, Q_3,$ to $Q_{2^N-1}$ of the flash ADC.

Furthermore, the comparators $C_1^1, C_2^1, C_3^1, \ldots, C_{2^N-1}^1$ are synchronous, in other words they deliver the result of their comparison on the rising or falling edges of a sampling clock H.

The flash ADC thus quantizes the signal $V_{in}$ with a constant quantization step while simultaneously sampling it at the frequency of the clock H signal.

Given the parallel arrangement of the comparators $C_1^1, C_2^1, C_3^1, \ldots, C_{2^N-1}^1$, very high speeds can be attained. Commonly the conversion speed of this type of converter is restricted solely by the operating speed of the comparators.

But a flash ADC poses the following problems.

Firstly, the signal $V_{in}$ needs to be amplified in terms of amplitude in order to make best use of the dynamic range of the ADC. There is thus a biased amplification at the level of each comparator. Indeed, considering this linear ADC, it may be considered that the amplification by the amplifier $G^1$ is equivalent to a reduction, by the gain of the amplifier $G^1$, of all the threshold voltages $V_1, V_2, V_3, \ldots, V_{2^N-1}$. The amplification of the signal $V_{in}$ may thus be seen as included in the comparison function itself, in other words a comparison that includes an amplification biased by the presence of the threshold voltages.

Then, the signal to be quantized $V_{in}$ also needs to be amplified in terms of power, in order to charge the $2^N-1$ comparators $C_1^1, C_2^1, C_3^1, \ldots, C_{2^N-1}^1$ in parallel. Thus for the flash ADC to operate satisfactorily, the amplifier $G^1$ must therefore be powerful, linear, and low-noise. Moreover, in the case of weak signals for $V_{in}$, a significant amplification must be produced in a single stage. All these constraints make the amplifier $G^1$ difficult to design and in the best case scenario result in a high energy-consuming amplifier.

Additionally, to hold the charge in the comparators, it is often necessary, if not essential, to build in powerful buffers, which then increases consumption still further.

The purpose of the present invention is to resolve the aforementioned problems by proposing an energy-saving quantizer, which allows quantization comparable to that of flash ADCs, and in particular as regards the speed of quantization.

SUMMARY OF THE INVENTION

To this end the first object of the invention is an N-bit asynchronous quantizer comprising:

- $2^N-1$ signal amplifier stages arranged in series, the first stage input being capable of receiving a signal to be quantized; and
- $2^N-1$ comparators, one comparator being connected to the output of each amplifier stage, and capable of comparing the value of this output with a predetermined threshold voltage; and
- at least $2^N-2$ delay lines placed at the output of the $2^N-2$ first comparators, the outputs of the delay lines and of the last comparator defining the quantized binary values of the quantizer.

Put another way, with an architecture of this kind, amplification is implemented simultaneously with quantization, and gradually.

Thus, to obtain the amplification required for optimum use of the dynamic range of the quantizer, amplifiers may be used which have gains of the order of the gain of the flash ADC amplifier divided by $2^N$. In fact, these amplifiers are low-power, together consume less than the amplifier used in the flash ADC, and display a more linear behaviour.

Furthermore, since amplification is simultaneous with quantization, it is not necessary to provide amplification upstream of the quantizer to ensure that the dynamic range of the quantizer is effectively exploited in full.

Additionally, its gain may to advantage be selected between 1 and 2, in the knowledge that amplifiers offering such a gain are of straightforward design and reduced consumption.

Moreover, the architecture is relatively insensitive to the nonlinearities of its electronic components. Indeed, the non-linearities appear when the signals to which they are subjected assume high values. This is for example the case with saturation phenomena.

But, where a stage output exceeds the threshold associated therewith, it is known that the thresholds of the following comparators will also be exceeded on account of the amplification applied by the consecutive stages. The nonlinearities of the following amplifiers has thus no effect on quantization since the quantization implemented by an architecture of this kind starts with the most significant bit, associated with the first amplifier stage, and finishes with the least significant bit, associated with the last amplifier stage. This is especially advantageous when the signal to be quantized assumes a value greater than the first threshold, since all the nonlinearities of the following components in the chain have no effect on quantization. In fact, an amplifier only needs to be linear up to the threshold value associated therewith.

According to particular inventive embodiments, the quantizer includes one or more of the following features.

The absolute value of an amplifier stage gain is between about 1 and about 2. Low energy consuming low-gain amplifiers of straightforward design are thus used.

The amplifier stage gains are substantially identical. In such a case, a quantization with logarithmic compression is obtained, which is advantageous where the signals display a large dynamic range.

The absolute value of an amplifier stage gain, apart from the first one, is substantially equal to $i/(i-1)*G1$, where $G1$ is the first amplifier stage gain and i the position of the amplifier stage in the amplifier stage sequence. A quantization is thus obtained with constant step amplitudes between two consecutive amplifier stages. We are thus back to the quantization commonly implemented in flash ADCs.

The amplifier stage gain is negative. In this way, it is possible, simultaneously with the quantization, to rectify the signal to be quantized. Additionally, use may be made of inverters, which are low-energy consuming components of straightforward design.

An amplifier stage is also provided in order to filter the DC component of the signal to be quantized. This is particularly useful where the signal to be quantized theoretically displays a zero DC component. A parasitic DC offset is thus filtered. This is for example implemented using the amplifier stage gain which is chosen so as to be substantially zero at low frequencies.

Each amplifier stage is of the automatic gain control type. In this way, it is ensured that quantization occurs over the whole dynamic range of the signal $V_{in}$. This is particularly advantageous where RF reception is involved in order to match the strength of the signal received.

Each amplifier stage comprises:
a differential amplifier, whereof a positive input constitutes the amplifier stage input;
a first impedance, connected between a negative input and an output of the differential amplifier; and
a second impedance, connected between the negative input of the differential amplifier and an earth.

Each amplifier stage comprises a series arrangement of two amplifier cells, each of these cells consisting of:
an inverter, whereof the output constitutes the cell output,
a first impedance connected between the input and the output of the inverter, and
a second impedance connected at one of its terminals to the inverter input, and whereof the other terminal constitutes the cell input.

It is thus possible to shape the gain frequency response via an appropriate choice of the value of the impedances. For example, narrow band gains are conceivable of the band-pass type tuned to the signal to be quantized.

The amplifier stage may comprise:
an inverter, whereof the output constitutes the amplifier stage output,
a first impedance connected between the input and the output of the inverter, and
a second impedance connected at one of its terminals to the inverter input, and whereof the other terminal constitutes the stage input.

In this way, an interlaced quantization of the positive and negative half-waves of the signal to be quantized is obtained. The number of stages is thus divided by two on the assumption that the signal received varies little between the positive and negative half-waves.

Preferably, where an amplifier stage gain is negative, the quantizer further comprises a digital processing module capable of applying an "OR" function to each pair of consecutive outputs of the delay lines, the result of the "OR" function constituting a quantized binary value. The quantizer thus implements simultaneously a quantization and a rectification. Additionally, the last stage supplies the sign of the signal to be quantized.

Preferably, the DC value of the second impedance is substantially higher than the DC value of the first impedance, in order to filter the DC component and ensure that a DC offset, introduced for example by the quantizer components, does not propagate along the amplifier chain.

Preferably, the first impedance is the one defined between the drain and the source of an MOS transistor. It is thus possible to control the amplifier stage gain in a straightforward way by controlling the voltage applied to the gate of the MOS transistor. It is then possible to provide means for the automatic control of the amplifier stage gain via an appropriate control of this gate voltage.

The threshold value may be unique for all the comparators. Identical comparators may thus be selected for the quantizer thereby reducing the risks of the quantizer component characteristics being dispersed. Additionally, by using a single low value threshold voltage, the quantization properties (dynamic range of the quantization, logarithmic compression, constant step, etc.) are mainly fixed through the choice of amplifier stage gains.

Each comparator may comprise:
a high-gain differential amplifier, receiving on one positive input the corresponding amplifier stage output, and on a negative input the corresponding threshold value,
and a binary decision-making module, connected to the high-gain differential amplifier output.

Preferably, the binary decision-making module includes a discriminator with hysteresis. In this way, the quantized values are correctly saturated.

The quantizer may comprise a filtering module connected to the binary decision-making module output in order to eliminate pulses of duration below a predetermined duration. This translates into a noise reduction and better quantization behaviour at high frequencies.

The quantizer may further comprise a delay line connected to the output of each comparator, the delay lines being arranged in order to deliver the output of the comparators substantially at the same instant. Preferably, each delay line comprises $2^N-1-i$ substantially identical delay cells, where i is the position of the amplifier stage associated with the line in the amplifier stage sequence.

In this way, the delays induced by the propagation of the signal along the amplifier chain are compensated.

The quantizer may also comprise, at the start or at the end of the amplifier stage sequence, an additional amplifier stage, and an additional comparator connected to the additional amplifier stage output, and capable of comparing the output thereof with the zero value in order to determine the sign of the signal to be quantized.

Another object of the present invention is an N-bit analogue-to-digital converter comprising a quantizer of the aforementioned type and a sampler connected to the quantizer, and capable of sampling the signals it receives at input.

Put another way, in a converter of this kind, the quantization function is dissociated from the sampling function, which results from the quantizer architecture which is by nature asynchronous. It is thus possible to apply any asynchronous digital processing operation that may be deemed useful to the quantized signal before it is sampled.

This is particularly advantageous when the relevant information contained in the quantized signal is contained in a range of low frequencies, as is generally the case with the reception of modulated radiofrequency data, for which only the signal envelope is useful. Before sampling, it is therefore possible to apply an envelope extraction, by using a low-pass filter for example, and then to sample at low frequency. An energy saving is then obtained since it is unnecessary to provide a high energy consuming high-speed sampler.

According to particular inventive embodiments, the converter comprises one or more of the following features.

The converter may comprise a digital processing module connected between the quantizer and the sampler.

A further object of the invention is an ultra-wide band receiver comprising a converter of the aforementioned type.

BRIEF DESCRIPTION OF THE DRAWINGS

The invention will be better understood from reading the following description, given solely by way of example, and produced in relation to the appended drawings, wherein:

FIG. 1 is a diagrammatic view of a conventional flash ADC, which has already been discussed in the pre-characterizing portion;

FIG. 2 is a diagrammatic view of a first embodiment of the inventive quantizer;

FIGS. 3 to 6 are graphs showing the quantization implemented by the invention compared with the quantization implemented by a conventional flash ADC;

FIG. 7 is a diagrammatic view of a first embodiment of an amplifier stage forming a constituent part of the quantizer in FIG. 2;

FIG. 8 is a diagrammatic view of a second embodiment of an amplifier stage forming a constituent part of the quantizer in FIG. 2;

FIG. 9 is a diagrammatic view of a comparator forming a constituent part of the quantizer in FIG. 2;

FIGS. 10 and 11 show a discriminator with hysteresis forming a constituent part of the comparator in FIG. 9;

FIGS. 12 to 14 are diagrammatic views of different embodiments of delay cells forming a constituent part of the quantizer in FIG. 2;

FIG. 15 is a diagrammatic view of an inventive ADC;

FIG. 16 is a diagrammatic view of an inventive ultra-wide band receiver;

FIGS. 17 to 22 are timing diagrams showing the different processing steps implemented by the rectifier ADC in FIG. 16; and FIG. 23 is a particular embodiment of the receiver in FIG. 16.

DETAILED DESCRIPTION OF THE INVENTION

Quantizer According to the Invention

In FIG. 2, an N-bit voltage quantizer 20 includes $2^N-1$ quantization stages $E_1^2$-$E_{2^N-1}^2$ arranged in series.

Each quantization stage $E_1^2$-$E_{2^N-1}^2$ comprises:
a voltage amplifier $G_1^2$-$G_{2^N-1}^2$ of predetermined gain;
a voltage comparator $C_1^2$-$C_{2^N-1}^2$, whereof the positive input (+) is connected to the output of the voltage amplifier $G_1^2$-$G_{2^N-1}^2$, and whereof the negative input (−) receives a unique threshold voltage $V_{th}$; and
a delay cell $D_1^2$-$D_{2^N-1}^2$, whereof the input is connected to the output of the voltage comparator $C_1^2$-$C_{2^N-1}^2$, and which applies a predetermined delay to this output.

The voltage amplifiers $G_1^2$-$G_{2^N-1}^2$ are connected in series, the first $G_1^2$ of them receiving a voltage to be quantized $V_{in}$.

The outputs of the delay cells $D_1^2$-$D_{2^N-1}^2$ constitute for their part the quantized binary values $Q_1$-$Q_{2^N-1}$ of the N-bit quantizer 20. Their delay is selected to compensate the delay accumulating along the amplifier chain constituted by the amplifiers $G_1^2$-$G_{2^N-1}^2$, in such a way that the binary values $Q_1$-$Q_{2^N-1}$ are temporally adjusted to the same instant, thereby obtaining a temporal coherence for them.

It is thus possible to quantize an input signal asynchronously in continuous time, in other words a non-sampled signal, since the signals continuously supplied to the output of the delay cells $D_1^2$-$D_{2^N-1}^2$ constitute the quantized binary values corresponding to the input signal with a time shift corresponding to the propagation time through the quantizer.

It will be noted that the last delay cell $D_{2^N-1}^2$ is optional, as in the example relative to FIG. 23 described hereinafter.

Optionally, the quantizer 20 also comprises a stage 22 for the determination of the sign of the voltage $V_{in}$. The stage 22 comprises an amplifier 24, arranged in series with the amplifier $G_{2^N-1}^2$ of the last quantization stage $E_{2^N-1}^2$.

The stage 22 includes furthermore a comparator 26, connected by its positive input (+) to the output of the amplifier 24, and receiving at its negative input (−) a zero voltage, the output of the comparator 26 thereby giving the sign of the voltage $V_{in}$. In a first alternative embodiment of the quantizer in FIG. 2, a quantization with logarithmic compression is implemented by choosing for the gains of the amplifiers $G_1^2$-$G_{2^N-1}^2$ a unique predetermined value G.

Indeed, in a situation of this kind, the voltage $V_{in}$ is quantized in accordance with the scale of values $$\left\{ \frac{V_{th}}{G^{2^N-1}}, \cdots, \frac{V^{th}}{G^3}, \frac{V_{th}}{G^2}, \frac{V_{th}}{G} \right\}.$$

This alternative is for example useful in an application to the quantization of a signal displaying a wide dynamic range.

In a second alternative embodiment of the quantizer in FIG. 2, a quantization with a constant step amplitude, in other words a quantization similar to that implemented in a conventional flash ADC, is implemented by choosing for each amplifier $G_i^2$-

$$\frac{G_{i^{2N-1}}^2}{i-1},$$

from the second position in the amplifier chain a gain substantially equal to where i is the position of the amplifier in the chain.

Indeed, in a situation of this kind, the voltage $V_{in}$ is quantized in accordance with the scale of values $$\left\{ \frac{V_{th}}{(2^N-1) \times G_1}, \cdots, \frac{V_{th}}{3 \times G_1}, \frac{V_{th}}{2 \times G_1}, \frac{V_{th}}{G_1} \right\},$$

where $G_1$ is the gain of the first amplifier $G_1^2$ in amplifier chain.

FIGS. 3 to 6 show a quantization of this kind with constant step amplitude.

FIGS. 3 and 4 show the quantization implemented by the conventional flash ADC in FIG. 1. In FIG. 3, the temporal evolution of the amplified voltage G×$V_{in}$ at the output of the amplifier $G^1$ is shown, as are the first four threshold voltages $V_1$, $V_2$, $V_3$ and $V_4$. FIG. 4 shows the corresponding temporal evolution of the first four quantized values $Q_1$, $Q_2$, $Q_3$ and $Q_4$ at the output of the first four comparators $C_1^1$, $C_2^1$, $C_3^1$, $C_4^1$.

FIGS. 5 and 6 for their part show the quantization with constant step amplitude implemented by the quantizer in FIG. 2, also for the first four quantized values $Q_1$, $Q_2$, $Q_3$ and $Q_4$.

As may be noted, the quantization obtained by quantizing these two devices is identical.

However, in the conventional flash ADC, it is necessary to amplify the voltage $V_{in}$ with a very significant gain in order to obtain a comparison with all the reference voltages $V_1$, $V_2$, $V_3$, ... $V_{2^N-1}$.

In the inventive quantizer, when a unique threshold voltage $V_{th}$ is chosen for all quantization stages $E_1^2$-$E_{2^N-1}^2$, it is unnecessary to amplify the voltage in order to be sure of using the whole dynamic range of the quantization if the amplifier gains are chosen as a consequence and/or are variable gains.

Preferably, the gains of the amplifiers $G_1^2$-$G_{2^N-1}^2$ from the second amplifier $G_2^2$ are strictly between 1 and 2. The gain of the first amplifier $G_1^2$ may for its part be equal to 1.

It is in fact known that it is straightforward to produce amplifiers that have such gains. Additionally, such amplifiers consume little energy and display great linearity compared with high-gain amplifiers, such as the amplifier $G^1$ used in a conventional flash ADC in FIG. 1.

Also preferably, the gains of the amplifiers $G_1^2$-$G_{2^N-1}^2$ are selected as a function of the particular use to which the quantizer is to be put.

To be more specific, amplifiers display a non-zero gain solely in the expected frequency band of the voltage $V_{in}$. For example, in the event of an expected voltage $V_{in}$ not comprising a DC component, the gains of the amplifiers $G_1^2$-$G_{2^N-1}^2$ are of the high-pass or pass band type, so as to filter the low frequencies.

This is particularly advantageous since the amplifier frequency band selection effects accumulate along the amplifier chain. Thus, for the last quantization stages, a parasitic, for example DC, component received at input is substantially cancelled by successively filtering it through the amplifiers $G_1^2$-$G_{2^N-1}^2$. Considering for example identical gains with a −20 dB attenuation of the DC, the filtering of the DC at the quantizer output is −($2^N$−1)*20 dB, without however providing for complex filters.

This is particularly advantageous in so far as the last quantization stages, which correspond to the least significant bits of the quantization, are intended for the quantization of low value signals that are particularly sensitive to extraneous noise and nonlinearities.

Additionally, the fact of using limited frequency band amplifiers makes it possible also to use limited frequency band comparators $C_1^2$-$C_{2^N-1}^2$ that consume less energy than wide band comparators, as is commonly the case with conventional flash ADCs.

A first embodiment 70 of an amplifier $G_1^2$-$G_{2^N-1}^2$ is shown in FIG. 7.

The amplifier 70 comprises:
a differential amplifier 72 of gain A, receiving on its positive terminal (+) the voltage for amplification, and delivering at its output the amplified voltage,
a first impedance 74 of value $Z_1$, connected between the output of the differential amplifier 72 and the negative terminal (−) thereof,
and a second impedance 76 of value $Z_2$, connected between the negative terminal (−) of the differential amplifier 72 and the earth.

The transfer function between the output S and the input E of the amplifier 70 is thus given by the relation:

$$\frac{S}{E} = \frac{A \times (Z_1 + Z_2)}{Z_1 + (1+A) \times Z_2}.$$

The effect of the negative feedback by means of the impedance 74 is to adjust the gain of the amplifier 70 with precision. Indeed, gain adjustment is more accurate using the passive component constituted by the impedance 74 than by using an active component.

The values $Z_1$ and $Z_2$ of the impedances 72 and 74 are furthermore selected in order to shape the frequency response of the amplifier 70, for example as a function of the frequency band of the voltage to be quantized $V_{in}$, as has been mentioned above.

Preferably, the values $Z_1$ and $Z_2$ are also chosen so that the transfer function of the amplifier 70 is of the high-pass type, so as not to amplify a parasitic DC offset $V_{offset}$ that may appear between the positive (+) and negative (−) terminals of the differential amplifier 72. It is known in fact that it is a common occurrence for the response of the differential amplifier 72 to be of the type S=A($V_+$−$V_-$+$V_{offset}$), where $V_+$ and $V_-$ are the voltages at the positive (+) and negative (−) terminals of the differential amplifier 72 respectively and $V_{offset}$ a parasitic DC offset.

So, for DC, the value of $Z_2$ is substantially greater than the value of $Z_1$. For example, the impedance 76 is a resistance, and the impedance 74 is constituted by a resistance in parallel with an inductance, or the impedance 74 is a resistance and the impedance 76 is constituted by a resistance in series with a capacitor.

When a resistance is chosen for one and/or the other of the impedances 74 and 76, it is preferably implemented in the form of the resistance between the drain and the source of an MOS transistor. The value of this resistance, and therefore that of the gain of the amplifier 70, may thus be adjusted by the voltage applied to the gate of the MOS transistor.

A gain control is also implemented by steering this gate voltage.

FIG. 8 is a diagrammatic view of a second embodiment 80 of an amplifier $G_1^2$-$G_{2^N-1}^2$.

According to this embodiment, the amplifier 80 comprises two identical amplification cells 82, 84 arranged in series. Each cell 82, 84 comprises an inverter 820, 840 of gain A, and is constituted by the output thereof. The cell 82, 84 also comprises a first impedance 822, 842 of value $Z_1$, connected between the input and the output of the inverter 820, 840, and a second impedance 824, 844 of value $Z_2$, connected at one of its terminals to the input of the inverter 822, 842, and whereof the other terminal constitutes the input of the cell 82, 84. The transfer function between the output S and the input E of the amplifier 80 is thus given by the relation:

$$\frac{S}{E} = \left( \frac{A \times Z_1}{Z_1 + (1+A) \times Z_2} \right)^2$$

The values $Z_1$ and $Z_2$ of the impedances are selected in a similar way to the embodiment described in relation to FIG. 7.

This second embodiment is advantageous since we have here access to the inverted signal, which gives a comparison on the positive and negative half-waves of the signal without having to change either the comparators or the comparison thresholds. The inverter is in fact the most straightforward of inverting amplifiers.

An operational amplifier is not therefore justified particularly because of the DC filtering. To do this, a comparator may be added at the output of each cell 82 or a single inverting cell (82 or 84) may be used for each amplifier.

In FIG. 9, an embodiment 90 is shown of a comparator $C_1^2$-$C_{2^N-1}^2$ of the quantizer in FIG. 2.

The comparator 90 includes a differential amplifier 92 of gain A, receiving on its positive terminal (+) the output of the amplifier $G_1^2$-$G_{2^N-1}^2$, 24 with which it is associated, and on its negative terminal (−) the threshold voltage $V_{th}$.

The comparator 90 also comprises a discriminator with hysteresis 94, connected at the output of the differential amplifier 92. The discriminator 94 makes the binary decision as to whether the voltage on the terminal (+) is greater than the voltage on the terminal (−) of the amplifier 92 by supplying at output a correctly saturated signal.

Lastly, as an option, the comparator 90 comprises a peak detecting low-pass filter 96, connected at the output of the discriminator 94.

This filter 96 comprises a delay cell 960, connected at the output of the discriminator 94, and applying a delay of predetermined value τ to the voltage it receives at input. The filter 96 also comprises "OR" logic 962 and "NAND" logic 964 gates, each connected at the output of the discriminator 94 and of the delay cell 960, and a low-level sensitive RS flip-flop constituted by two interconnected "NAND" gates 966, 968.

The filter 96 thus eliminates pulses of a duration less than the delay τ. The value of τ is preferably chosen in such a way that its inverse is greater than or equal to the Shannon frequency of the voltage $V_{in}$ to be quantized. Thus, by means of the filter 96, interference pulses, such as might be caused for example by high-frequency interference, are substantially eliminated.

FIG. 10 is an example of an embodiment 100 of the discriminator 94 and FIG. 11 is a hysteresis implemented by this embodiment of the discriminator 94.

The discriminator 100 comprises two logic inverters 102, 104 in series, a first resistance 106 of value $R_1$ connected in parallel with the two inverters 102, 104, and a second resistance 108 of value $R_2$, connected at the input of the first inverter 102. The free terminal of the second resistance 108 constitutes the input E of the discriminator 100 and the output of the second inverter constitutes the output S thereof.

As can be seen in FIG. 11, the hysteresis voltage is substantially equal to $$V \times \frac{R_1}{R_2},$$

where V is the half-amplitude of the binary outcome, where 2V is the supply voltage of the inverters 102, 104, in other words also the output amplitude thereof.

FIGS. 12 to 14 are diagrammatic views of embodiments 120, 130 and 140 of delay cells $D_1^2$-$D_{2^N-1}^2$.

The cell 120 in FIG. 12 comprises two branches 122, 124 of MOS transistors. Each branch is constituted by:
  a first p-channel MOS transistor 1220, 1240, whereof the source is connected to the earth and whereof the gate is connected to a voltage $V_{com}$ for adjusting the delay of the cell 120,
  a second p-channel MOS transistor 1222, 1242, whereof the source is connected to the drain of the first MOS transistor 1220, 1240,
  and an n-channel MOS transistor 1224, 1244, whereof the drain is connected to the drain of the second MOS transistor 1222, 1242 and whereof the source is connected to the earth.

The gates of the second p-channel MOS transistor 1222 and of the n-channel transistor 1224 of the first branch 122 are common and are connected to the input E of the cell 120. The gates of the second p-channel MOS transistor 1242 and of the n-channel transistor 1244 of the second branch 122 are common and are connected to the output S of the cell 120.

The delay cell 130 in FIG. 13 is identical to that in FIG. 12 except that the first p-channel MOS transistor of the second branch is omitted.

The cell 120 in FIG. 12 delays both the rising edges and the falling edges of a signal applied to the input E, whereas the cell 130 in FIG. 13 delays only the falling edges.

Furthermore, the effect of the presence of the additional MOS transistor 1240 in the cell 120 is to reduce the switch current of the transistors as a function of the adjustment voltage Vcom.

The delay cell 140 in FIG. 14 comprises for its part two n-channel MOS transistors 1400, 1402, having their sources in common, two capacitors 1404, 1406 connected between the drains of the transistors 1400, 1402 and the earth respectively, and a current source 1408 connected between the sources of the transistors 1400, 1402 and the earth. The input E of the cell 140 is connected to the gates of these transistors and the output S to the drains thereof. The value of the delay applied by the cell 140 is adjusted by the value of the current $I_{com}$ from the current source 1408.

The cell 140 offers a higher operating speed than that of the cells 120, 130 in FIGS. 12 and 13, but requires the polarization current $I_{com}$ on a permanent basis.

Analogue-to-Digital Converter According to the Invention

FIG. 15 is a diagrammatic view of an analogue-to-digital converter 150 that incorporates an inventive quantizer.

The ADC comprises an inventive quantizer 1500, for example the one in FIG. 2, and a sampler 1502, whereof the sampling frequency is that of a clock H. The sampler is for example constituted by a register of $2^N-1$ D-type flip-flops.

In a particularly advantageous way, the ADC 150 also includes an asynchronous digital processing circuit 1504, arranged between the quantizer 1500 and the sampler 1502, and implementing any operation deemed useful on the quantized signal.

The quantized values of the voltage $V_{in}$ are thus processed before sampling. This is made possible by the fact that the inventive quantizer is asynchronous by nature given the signal propagation delays along the amplifier chain.

Conventionally, in the case of a flash ADC, a processing operation is performed on the quantized and sampled values at the output thereof. But, it is known that a processing operation on such values in reality requires the sampled values to be reconverted into digital values to allow logic operations. Processing in respect of the non-sampled quantized values thereby allows this step to be saved, involving in fact an operation speed and consumption gain.

Clearly, it is also possible to provide for no digital processing of the quantized values before the sampling thereof. In such a scenario, the quantizer is directly connected to the sampler.

Application to Ultra-Wide Band Pulse Reception

The radio transmission of digital or analogue information is commonly implemented by converting this information by modulation into a signal, whereof the frequency domain, constituted by one or more high-frequency bands, is compatible with transmission by radio wave (RF). This transmission is performed without wire support, and in general in a transmission channel which is constituted by the environment (air or vacuum for example) located between the sender and the receiver of the RF signal. Once received, the RF signal is demodulated to retrieve the initial information in the frequency base band thereof.

At least two types of RF transmission may be distinguished, namely a transmission by modulated carrier and a transmission by pulse signals, for example of the radar type.

In the case of a transmission by modulated carrier, the RF signal is produced by combining one or more modulated sinusoidal signals, which have the particular feature of being sent during most of, if not throughout the entire length of the transmission. The RF signal is therefore sent continuously.

In the case of an RF transmission by pulse signals, the RF signal is a modulated pulse, generally of short duration relative to the total length of transmission, but regularly repeated. Sending is therefore performed discontinuously. Since short pulses occupy a very wide frequency spectrum, we often talk about ultra-wide band (UWB) pulse transmission.

Today, many RF transceivers are designed to send digital information rather than analogue information on account of the ever greater possibilities offered by digital signal processing. It can thus be seen, in an RF receiver, that an analogue-to-digital conversion is performed as soon as possible after reception, sometimes even at the output of the receiving antenna, in order to benefit as quickly as possible from the advantages offered by digital processing.

However, placing an analogue-to-digital converter as close as possible to the antenna of the RF receiver, in other words upstream from the demodulation components which convert the signal in the base band, compels, except in very special sub-sampling scenarios, sampling at least twice the highest frequency of the spectrum of the RF signal received. In fact, a sampling at very high frequency (of the order of several gigahertz) involves on the one hand the use of very fast converters, commonly flash ADCs, and on the other hand a digital demodulation from a very large data flow (of the order of a gigabyte a second).

Such RF receivers have not thus far proved satisfactory, particularly in terms of consumption.

Furthermore, in the case of non-coherent UWB detection by detecting the energy of the pulses of the RF signal received, as described for example in the document WO 2005/074150, the instantaneous power of the RF signal received is approximated by measuring the absolute value of this signal by rectification thereof.

In fact, an effective rectification is obtained for a signal of sufficiently large amplitude. It is thus necessary to provide in the UWB receiver, non-coherent by energy detection, a strong amplification of the amplitude of the signal received, and typically an amplification of about 70 dB. A part of the amplification gain is commonly obtained by the low-noise amplifier, and typically a gain of about 20 dB. The remainder of the amplification is implemented using specific amplifier stages.

FIG. 16 is a diagrammatic view of a UWB receiver 160 non-coherent by energy detection. This receiver 160 comprises an ADC according to the invention. This ADC resolves both the energy consumption problem and the problem of sampling at very high frequency through the use of an inventive quantizer, since it does not require much energy and allows the quantization function to be separated from the sampling function.

The UWB receiver 160 comprises a conventional RF receiving antenna 1600 and a conventional low-noise amplifier 1602.

The receiver 160 further comprises a logarithmic compression quantizer 1604 according to the invention, as described in relation to FIG. 2. The quantizer 1604 is connected to the amplifier 1602 and quantizes the amplified RF signal at the output thereof.

A module 1606, applying a rectification and filtering and low-pass function, is also provided at the output of the quantizer 1604.

The rectification implemented by the module 1606 comprises for example adjusting the sign of the quantized signal to 0.

The low-pass filtering of the module 1606, for example in the form of a finite or infinite impulse response filter, substantially reduces the pass band of the quantized signal so as to lower the sampling frequency subsequently implemented by one order of magnitude. Only the received signal envelope is thus retained, in other words the useful part thereof.

Furthermore, a sampler 1608, constituted by a register with $2^N-1$ D-type one-shot flip-flops, is connected at the output of the low-pass filter in order to sample the quantized values delivered thereby.

Lastly, a thermometric encoder 1610, connected to the sampler 1608, encodes the quantized and sampled values at the output thereof, according to a desired binary coding, such as a Gray coding for example.

FIGS. 17 to 22 show the different processing steps implemented by the receiver 160 on an example of pulses received, in this case of the square root raised cosine type at a centre frequency of 4.5 GHz and having a frequency band of 700 MHz. The sampling frequency in this case is 2 GHz.

FIG. 23 is another embodiment of the quantizer 1604, of the rectification and low-pass filtering 1606 and sampling 1608 module of the receiver 160 in FIG. 16.

In this embodiment, the quantizer, here given the reference number 230, is constituted by $2^N-1$ quantization stages $E_1^{23}$-$E_{2^N-1}^{23}$ arranged in series and by a triangular matrix 232 of delay cells of value τ.

Each of these stages $E_1^{23}$-$E_{2^N-1}^{23}$ comprises a first CMOS inverter I1, whereof the output constitutes the output of the stage, an n-channel CMOS transistor M1 and a capacitor Cs, connected at one of its terminals to the input terminal of the inverter I1 and whereof the other terminal constitutes the input of the quantization stage $E_1^{23}$-$E_{2^N-1}^{23}$.

The capacitor Cs filters a parasitic DC component of the signal $V_{in}$ to be quantized. Indeed, in the context of the application to UWB reception, the signal comprises no DC component when it is not subject to interference.

The drain-to-source path of the transistor M1 is assembled in negative feedback on the first inverter I1, and the gate of the transistor M1 is connected to a control voltage Vgain. The value of the gate voltage Vgain of the transistor M1 adjusts the amplification gain produced by the amplifier stage, a gain which in this case is negative.

Each quantization stage $E_1^{23}$-$E_{2^N-1}^{23}$ further comprises a second CMOS inverter I2, connected at the output of the first inverter I1. The second inverter I2 is chosen to be different from the first inverter I1 in such a way that the inverter I2 amplifies the output of the first inverter I1 with a predetermined voltage bias. This bias corresponds to the threshold voltage $V_{th}$ required for the quantization implemented by the quantization stage $E_1^{23}$-$E_{2^N-1}^{23}$. This is for example achieved by choosing transistors of different size for the inverters I1 and I2.

Lastly, each quantization stage $E_1^{23}$-$E_{2^N-1}^{23}$ includes a discriminator with hysteresis H, for example the one described in relation to FIG. 10.

The triangular matrix 232 comprises for its part a series of consecutive delay cells for each quantization stage $E_1^{23}$-$E_{2^N-1}^{23}$, the number of consecutive delay cells for the $i^{th}$ quantization stage being equal to $2^N-1-i$, so as to compensate the propagation time in the stages $E_1^{23}$-$E_{2^N-1}^{23}$.

The quantizer 230 further comprises a filter 234. The filter 234 performs, in combination with the quantization stages $E_1^{23}$-$E_{2^N-1}^{23}$, a rectification function.

To be more specific, assuming the gains to be equal to $-G$ for the quantization stages $E_1^{23}$-$E_{2^N-1}^{23}$, with G a predetermined positive number, a comparison is made using the odd-numbered quantization stages $E_1^{23}, E_3^{23}, \ldots, E_{2^N-1}^{23}$ of the voltage $V_{in}$ to be quantized (the voltage at the low-noise amplifier output) with the values $$\left\{-\frac{V_{th}}{G^{2N-1}}, \ldots, -\frac{V^{th}}{G^3}, -\frac{V_{th}}{G}\right\}.$$

Furthermore, a comparison is made using the even-numbered quantization stages $E_2^{23}, E_4^{23}, \ldots, E_{2^N-2}^{23}$ of the voltage $V_{in}$ with the values $$\left\{\frac{V_{th}}{G^{2N-2}}, \ldots, \frac{V^{th}}{G^4}, \frac{V_{th}}{G^2}\right\}.$$

In fact, the odd-numbered stages quantize the absolute value of the negative half-waves of the voltage $V_{in}$ whereas the even-numbered stages quantize the absolute value of the positive half-waves of the voltage $V_{in}$. An interlaced quantization of the positive and negative half-waves of the voltage $V_{in}$ is thus obtained.

The filter 234 also implements a low-pass filtering by peak detection. This filtering is performed by extending, by a predetermined period of time $\delta$, each quantized value $Q_1$-$Q_{2^N-1}$ at the output of the matrix 232. For each of the quantized values $Q_1$-$Q_{2^N-1}$, the filter 234 comprises to this end an "OR" gate 2340 through which the quantized value is combined with a value of itself delayed using a delay cell 2342 of value $\delta$.

The filter 234 also combines, using "OR" gates 2344, the extended quantized values associated with two consecutive quantization stages. For example, by denoting as $Q'_1$-$Q'_{2^N-1}$ the extended quantized values, the filter 234 produces, apart from for the first extended quantized value $Q'_1$, the logic combinations $Q''_i = Q'_i$ OU $Q'_{i+1}$. A rectification of the quantized negative half-waves of the voltage $V_{in}$ is thus obtained. Lastly, a sampler 236 is also provided to sample the quantized, extended and rectified values at the output of the filter 234.

Although a quantizer has been described with a unique threshold value, it will be understood that it is possible to choose different values for the comparison.

The invention claimed is:

1. An N-bit asynchronous quantizer including:
   $2^N-1$ signal amplifier stages ($G_1^2$-$G_{2^N-1}^2$; I1, Cs, M1) arranged in series, the input of the first stage being capable of receiving a signal to be quantized;
   $2^N-1$ comparators ($C_1^2$-$C_{2^N-1}^2$; I2, H), one comparator being connected to the output of each amplifier stage ($G_1^2$-$G_{2^N-1}^2$; I1, Cs, M1), and capable of comparing the value of this output with a predetermined threshold value; and
   at least $2^N-2$ delay lines ($D_1^2$-$D_{2^N-1}^2$) placed at the output of the $2^N-2$ first comparators, the signals supplied at the output of the delay lines ($D_1^2$-$D_{2^N-1}^2$) and of the last comparator constituting at any instant the quantized binary values of the input signal with a time shift,
   wherein the quantizer further comprises, at the start or at the end of the amplifier stage sequence, an additional amplifier stage, and an additional comparator connected to the output of the additional amplifier stage and capable of comparing the output thereof with the zero value in order to determine the sign of the signal to be quantized.

2. The quantizer as claimed in claim 1, wherein the absolute value of the gain of an amplifier stage ($G_1^2$-$G_{2^N-1}^2$; I1, Cs, M1) is between about 1 and about 2.

3. The quantizer as claimed in claim 1, wherein the gain of the amplifier stages ($G_1^2$-$G_{2^N-1}^2$; I1, Cs, M1) is substantially identical.

4. The quantizer as claimed in claim 1, wherein the absolute value of the gain of an amplifier stage ($G_1^2$-$G_{2^N-1}^2$; I1, Cs, M1), apart from the first one, is substantially equal to $i/(i-1)$ *G1, where G1 is the gain of the first amplifier stage and i is the position of the amplifier stage in the amplifier stage sequence.

5. The quantizer as claimed in claim 1, wherein the gain of the amplifier stages is negative.

6. The quantizer as claimed in claim 1, wherein an amplifier stage ($G_1^2$-$G_{2^N-1}^2$; I1, Cs, M1) is also arranged to filter the DC component of the signal to be quantized.

7. The quantizer as claimed in claim 1, wherein each amplifier stage ($G_1^2$-$G_{2^N-1}^2$; I1, Cs, M1) is of the automatic gain control type.

8. The quantizer as claimed in claim 1, wherein each amplifier stage ($G_1^2$-$G_{2^N-1}^2$) comprises:
   a differential amplifier, whereof a positive input constitutes the input of the amplifier stage;
   a first impedance connected between a negative input and an output of the differential amplifier; and
   a second impedance connected between the negative input of the differential amplifier and the earth.

9. The quantizer as claimed in claim 1, wherein each amplifier stage ($G_1^2$-$G_{2^N-1}^2$) comprises a series arrangement of two amplifier cells, each of the cells consisting of:
   an inverter, whereof the output constitutes the output of the cell,
   a first impedance connected between the input and the output of the inverter, and
   a second impedance connected at one of its terminals to the input of the inverter, and whereof the other terminal constitutes the input of the cell.

10. The quantizer as claimed in claim 1, wherein each amplifier stage (I1, Cs, M1) comprises:
    an inverter (I1), whereof the output constitutes the output of the amplifier stage, a first impedance (M1) connected between the input and the output of the inverter (I1), and a second impedance (Cs) connected at one of its terminals to the input of the inverter, and whereof the other terminal constitutes the input of the stage.

11. The quantizer as claimed in claim 5, wherein it further comprises a digital processing module capable of applying an "OR" function to each pair of consecutive outputs of the delay lines and of the last comparator, the "OR" function outcome constituting a quantized binary value.

12. The quantizer as claimed in claim 8, wherein the DC value of the second impedance is substantially greater than the DC value of the first impedance.

13. The quantizer as claimed in claim 8, wherein the first impedance (M1) is the one defined between the drain and the source of an MOS transistor.

14. The quantizer as claimed in claim 1, wherein the threshold value is unique for all the comparators ($C_1^2$-$C_{2^N-1}^2$; I2, H).

15. The quantizer as claimed in claim 1, wherein each comparator ($C_1^2$-$C_{2^N-1}^2$) comprises:
   a high-gain differential amplifier receiving on a positive input the output of the corresponding amplifier stage, and on a negative input the corresponding threshold value, and
   a binary decision-making module connected at the output of the high-gain differential amplifier.

16. The quantizer as claimed in claim 15, wherein the binary decision-making module includes a discriminator with hysteresis.

17. The quantizer as claimed in claim 15, wherein it further comprises a filtering module connected at the output of the binary decision-making module in order to eliminate pulses of duration less than a predetermined duration.

18. The quantizer as claimed in claim 1, wherein each delay line comprises $2^N-1-i$ of the substantially identical delay cells, where i is the position of the amplifier stage (I1, M1, Cs) associated with the delay line in the amplifier stage sequence.

19. A N-bit analogue-to-digital converter including a quantizer as claimed in claim 1, wherein a sampler is connected to the quantizer and capable of sampling the signals it receives at input.

20. The analogue-to-digital converter as claimed in claim 19, wherein it comprises a digital processing module connected between the quantizer and the sampler.

21. A receiver of a radiofrequency signal of the type with a built-in converter as claimed in claim 19.

22. The receiver of a radiofrequency signal as claimed in claim 21, wherein the quantizer implements a quantization with logarithmic compression.

23. The receiver of a radiofrequency signal as claimed in claim 21, wherein the received signal to be quantized is a radiofrequency modulated carrier signal.

24. The receiver of a radiofrequency signal as claimed in claim 21, wherein the received signal to be quantized is an ultra wide band signal.

25. A receiver of a radio frequency signal, comprising an N-bit asynchronous quantizer including:
   $2^N-1$ signal amplifier stages ($G_1^2$-$G_{2^N-1}^2$; I1, Cs, M1) arranged in series, the input of the first stage being capable of receiving a radiofrequency signal to be quantized;
   $2^N-1$ comparators ($C_1^2$-$C_{2^N-1}^2$; I2, H), one comparator being connected to the output of each amplifier stage ($G_1^2$-$G_{2^N-1}^2$; I1, Cs, M1), and capable of comparing the value of this output with a predetermined threshold value; and
   at least $2^N-2$ delay lines ($D_1^2$-$D_{2^N-1}^2$) placed at the output of the $2^N-2$ first comparators, the signals supplied at the output of the delay lines ($D_1^2$-$D_{2^N-1}^2$) and of the last comparator constituting at any instant the quantized binary values of the input signal with a time shift; wherein the quantizer further comprises, at the start or at the end of the amplifier stage sequence, an additional amplifier stage, and an additional comparator connected to the output of the additional amplifier stage and capable of comparing the output thereof with the zero value in order to determine the sign of the signal to be quantized.

* * * * *